United States Patent
Oyama et al.

(10) Patent No.: US 6,861,738 B2
(45) Date of Patent: Mar. 1, 2005

(54) LAMINATED-CHIP SEMICONDUCTOR DEVICE

(75) Inventors: Katsuhiko Oyama, Tokyo (JP); Mitsuyoshi Endo, Yamato (JP); Chiaki Takubo, Tokyo (JP); Takashi Yamazaki, Yokohama (JP); Takashi Imoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 331 days.

(21) Appl. No.: 10/156,819

(22) Filed: May 30, 2002

(65) Prior Publication Data

US 2002/0180030 A1 Dec. 5, 2002

(30) Foreign Application Priority Data

Jun. 1, 2001 (JP) ........................................ 2001-167185

(51) Int. Cl.⁷ ............................................... H01L 23/02
(52) U.S. Cl. ..................... 257/686; 257/777; 257/685; 257/723
(58) Field of Search ................................ 257/686, 777, 257/685, 723

(56) References Cited

U.S. PATENT DOCUMENTS 5,394,010 A   2/1995   Tazawa et al.

FOREIGN PATENT DOCUMENTS

| JP | 10-107205 | 4/1998 |
| JP | 2002-510148 | 4/2002 |
| KR | 2001-34154 | 4/2001 |

OTHER PUBLICATIONS

Imoto; "Semiconductor Device and Manufacturing Method Thereof"; U.S. Appl. No. 09/648,373, filed Aug. 25, 2000.

*Primary Examiner*—David A. Zarneke
(74) *Attorney, Agent, or Firm*—Finnegan, Henderson, Farabow, Garrett & Dunner, L.L.P.

(57) ABSTRACT

There is disclosed a laminated-chip semiconductor device which comprises two chip-mounting substrates on each of which at least one semiconductor chip having a plurality of terminals for signals is mounted, and a plurality of chip connecting wirings electrically connected to the terminals for signals of the each semiconductor chip which are mounted on the chip-mounting substrates are formed in a same pattern, and which are laminated along a thickness direction, and one intermediate substrate which is arranged between the two chip-mounting substrates, and in which a plurality of interlayer connecting wirings electrically connected to each of the plurality of chip connecting wirings of the adjacent chip-mounting substrate are formed in a predetermined wiring pattern.

20 Claims, 14 Drawing Sheets

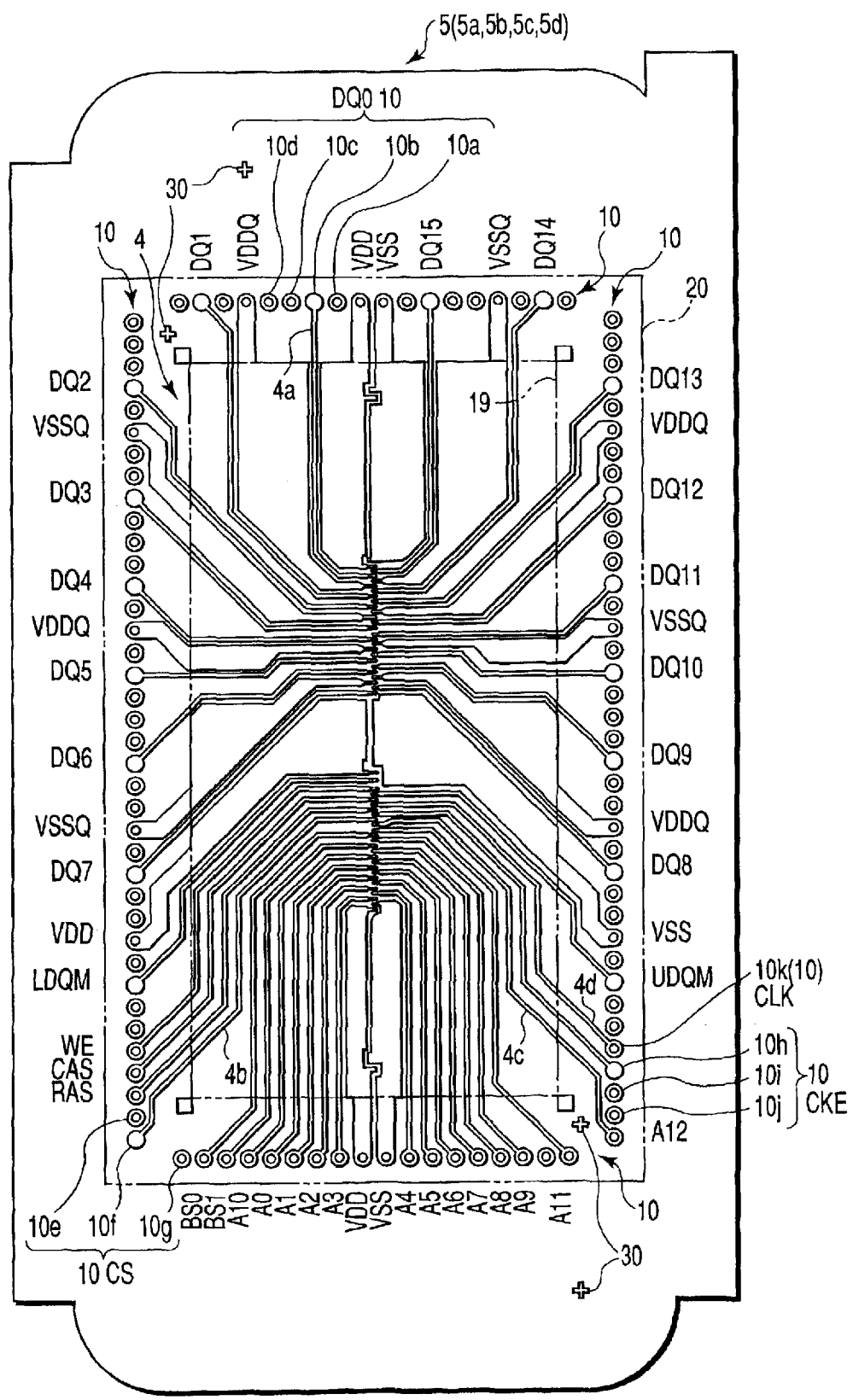
F I G. 3

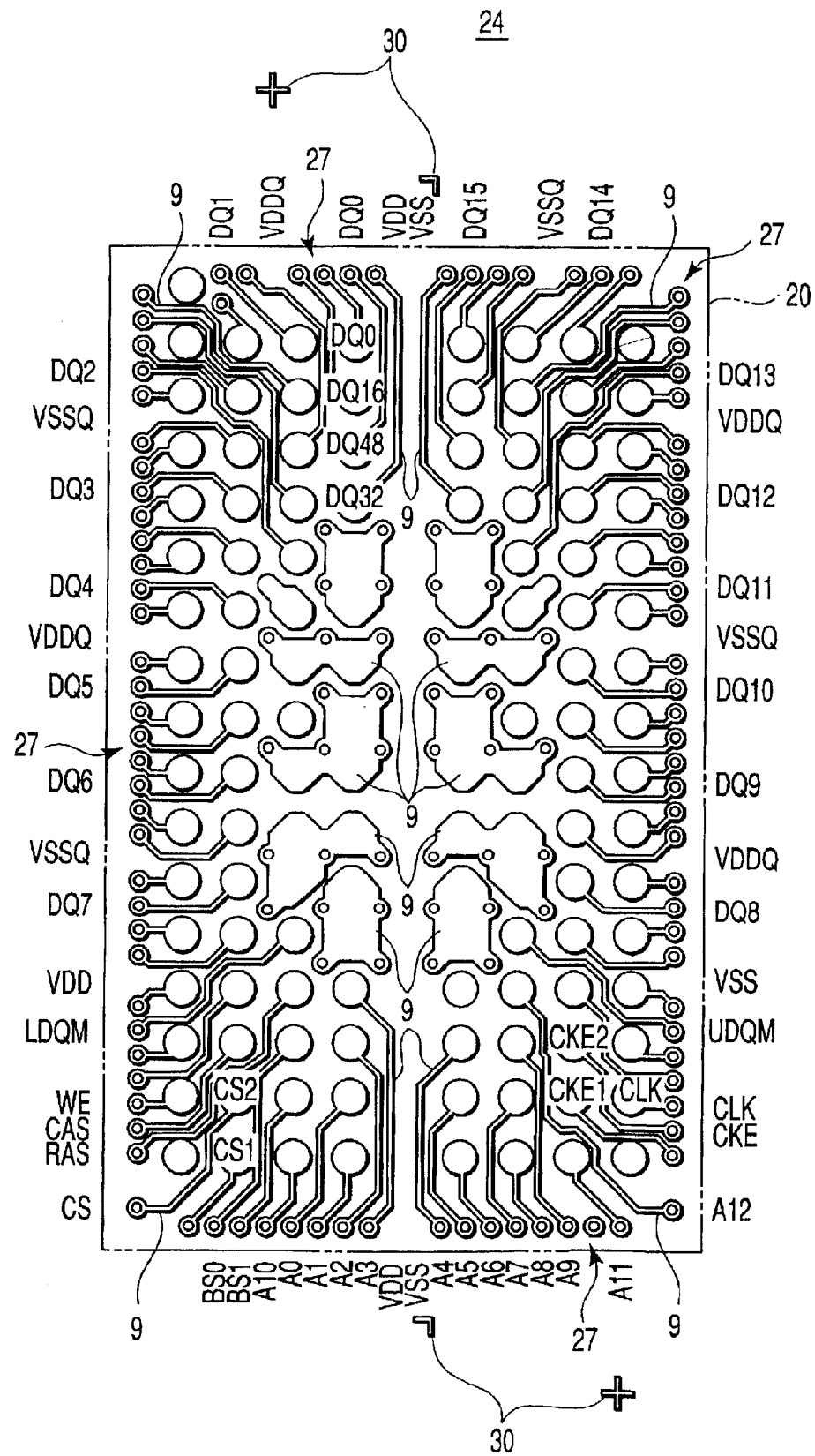
F I G. 10

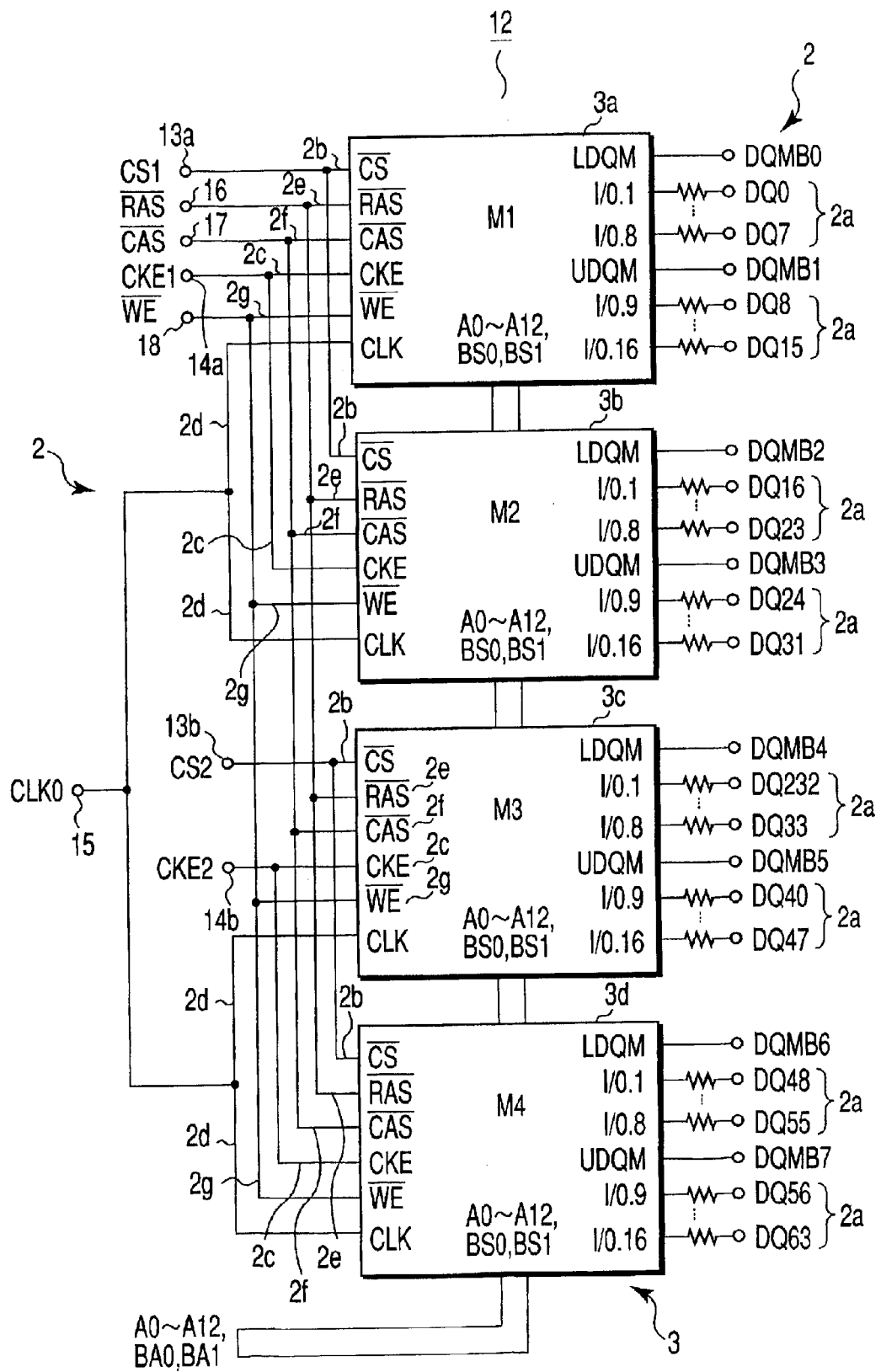
F I G. 11

LAMINATED-CHIP SEMICONDUCTOR DEVICE

CROSS-REFERENCE TO RELATED APPLICATIONS

This application is based upon and claims the benefit of priority from the prior Japanese Patent Application No. 2001-167185, filed Jun. 1, 2001, the entire contents of which are incorporated herein by reference.

BACKGROUND OF THE INVENTION

1. Field of the Invention

The present invention relates to a wiring technique around a semiconductor chip, particularly to a wiring design of a laminated semiconductor package as a semiconductor device having a multi-layered structure constituted by laminating a plurality of semiconductor chips in a plurality of layers.

2. Description of the Related Art

Examples of a semiconductor device include a laminated semiconductor package including a structure obtained by laminating a plurality of layers of semiconductor chips as shown in FIG. 17, that is, a so-called multi-chip package 101. The package 101 is constituted by laminating a plurality of memory chips 105 as the semiconductor chips, in four layers.

An outline of one example of a manufacturing process of the package 101 will be concretely described. First, the chips 105 are mounted one by one onto a plurality of chip-mounting substrates 104, for example, by a flip chip method. Subsequently, a plurality of chip-mounting substrates 104 with the chips 105 mounted thereon are laminated on one intermediate substrate 103 to constitute one system block 102. Subsequently, four blocks 102 are laminated in four layers and packaged to form one module. Thereby, the desired package 101 is obtained.

In general, each chip-mounting substrate 104 includes a chip connecting wiring (not shown) for electrically connecting a chip connecting via terminal (not shown) formed through a thickness direction to a pad (not shown) of the chip 105. Moreover, a via terminal and wiring (not shown) of the same pattern are formed on the intermediate substrate 103. Thereby, the respective chips 105 mounted on the chip-mounting substrate 104 are arranged as one unit for each block 102 and incorporated in the module.

Here, a data amount which can be individually stored for each block 102 is increased in order to increase the data amount which can be stored in the whole package 101. In this case, it is necessary to draw out a plurality of data pins (not shown) of the chip 105 to an external connection terminal (not shown) individually for each block 102. For this, a wiring pattern of a chip connecting wiring has to be formed separately for each layer of the chip-mounting substrate 104.

The wiring pattern for each layer will be briefly described with reference to FIGS. 18 to 21. Data pins 106 of the chip 105 are electrically connected to first to fourth chip connecting via terminals 107a to 107d formed on each of chip-mounting substrates 104a to 104d, and first to fourth interlayer connecting via terminals 108a to 108d formed on each of intermediate substrates 103a to 103d via the wiring pattern. FIGS. 18 to 21 schematically show constitutions of blocks 102a to 102d of first to fourth layers. Moreover, in FIGS. 18 to 21, inner two-dot chain lines show the chip-mounting substrates 104a to 104d of the first to fourth layers, and outer two-dot chain lines show the intermediate substrates 103a to 103d of the first to fourth layers.

On each of the chip-mounting substrates 104a to 104d, the first to fourth chip connecting via terminals 107a to 107d selectively and electrically connected to each of the data pins 106 of the chip 105 are provided at predetermined positions with respect to a mounted position of the chip 105. Similarly, on each of the intermediate substrates 103a to 103d, the first to fourth interlayer connecting via terminals 108a to 108d selectively and electrically connected to each of the data pins 106 of the chip 105 are provided at predetermined positions. The first to fourth interlayer connecting via terminals 108a to 108d are electrically connected to the first to fourth chip connecting via terminals 107a to 107d with a one-to-one correspondence.

Concretely, the first to fourth interlayer connecting via terminals 108a to 108d are continuously connected to the first to fourth chip connecting via terminals 107a to 107d along laminate directions of the blocks 102a to 102d, respectively. Thereby, the interlayer connecting via terminals 108a to 108d are individually and electrically connected to the data pins 106 via the chip connecting via terminals 107a to 107d. Additionally, in FIGS. 18 to 21, the chip connecting via terminals 107a to 107d are shown intentionally deviating from the interlayer connecting via terminals 108a to 108d so that wiring states therebetween can be easily understood. Additionally, in FIGS. 18 to 21, the electric connections between the chip connecting via terminals 107a to 107d and the interlayer connecting via terminals 108a to 108d is shown by a broken line.

Moreover, in actual fact, four chip-connecting via terminals 107a to 107d, and four interlayer-connecting via terminals 108a to 108d are provided for each of all the data pins 106 of the memory chip 105 of each layer. However, in order to understand the wiring state, description of the electric connection state of the chip connecting via terminals 107a to 107d and interlayer connecting via terminals 108a to 108d with respect to one data pin 106 is sufficient. Therefore, only four chip connecting via terminals 107a to 107d, and only four interlayer connecting via terminals 108a to 108d are shown, and the other terminals are omitted.

As described above, it is necessary to independently draw out the data pin 106 of the chip 105 to the external terminal. However, all the via terminals and wirings of the intermediate substrates 103a to 103d are formed in the same pattern. Therefore, for the data pin 106 of the chip 105 of each layer, for example, a data pin 106a via which data managed with the same address is inputted/outputted needs to be electrically connected to the chip connecting via terminals 107a to 107d which differ with each layer.

Therefore, as shown by a solid line in FIG. 18, a first chip connecting wiring 109a is formed on the first chip-mounting substrate 104a so that the data pin 106a is electrically connected to the first chip connecting via terminal 107a. Moreover, as shown by a solid line in FIG. 19, a second chip connecting wiring 109b is formed on the second chip-mounting substrate 104b so that the data pin 106a is electrically connected to the second chip connecting via terminal 107b. Furthermore, as shown by a solid line in FIG. 20, a third chip connecting wiring 109c is formed on the third chip-mounting substrate 104c so that the data pin 106a is electrically connected to the third chip connecting via terminal 107c. Additionally, as shown by a solid line in FIG. 21, a fourth chip connecting wiring 109d is formed on the fourth chip-mounting substrate 104d so that the data pin 106a is electrically connected to the fourth chip connecting via terminal 107d. In this manner, in the package 101, the first to fourth chip connecting wirings 109a to 109d are formed in predetermined wiring patterns which differ with each layer. This can increase the data amount stored in the whole package 101.

For example, in FIG. 17, every 200 substrates of the first to fourth chip-mounting substrates 104a to 104d each having one chip 105 mounted thereon are provided for the first to fourth intermediate substrates 103a to 103d to constitute the package 101. In this case, in an assembling process of the package 101, the respective chip-mounting substrates 104a to 104d each including 200 substrates need to be managed individually for the respective layers so that the substrates are prevented from being mixed among the layers. Moreover, to manufacture one package 101, the chip-mounting substrates 104a to 104d need to be classified for each layer and mounted on the intermediate substrates 103a to 103d so that the chip-mounting substrates 104a to 104d are disposed at predetermined layers, respectively.

Among 800 chip-mounting substrates 104a to 104d in total, for example, if only each one substrate for arbitrary two layers, that is, two substrates in total of the chip-mounting substrates 104a to 104d are mounted by mistake, the package 101 does not normally operate, and becomes defective. Therefore, there is a possibility that the package 101 has a remarkably low yield. It is remarkably difficult in an actual manufacturing line of the package 101 to manage all of the packages 101 manufactured in mass so that only two of a large number of chip-mounting substrates 104a to 104d are prevented from being mounted by mistake during a mounting operation. When a management system and workers are arranged in order to prevent such mistake, equipment and labor costs increase, a manufacturing cost thereby rises remarkably, and a unit price per unit of the package 101 increases. This remarkably becomes disadvantageous in price competition in a recent semiconductor industry. Moreover, since the manufacturing process of the package 101 easily becomes complicated in such a production system, it is difficult to improve a production efficiency of the package 101.

BRIEF SUMMARY OF THE INVENTION

According to one aspect of the present invention, there is provided a laminated-chip semiconductor device comprising: a semiconductor chip having a plurality of terminals for signals; a plurality of chip-mounting substrates on each of which at least one the semiconductor chip is mounted, and a plurality of chip connecting wirings electrically connected to the terminals for signals of the semiconductor chips which are mounted on the chip-mounting substrates are formed, and which are laminated in two or more layers in a thickness direction; and a plurality of intermediate substrates which are alternately arranged with respect to the plurality of chip-mounting substrates, and in which a plurality of interlayer connecting wirings electrically connected to the chip connecting wirings of an adjacent the chip-mounting substrate are formed, wherein each of the plurality of chip connecting wirings are formed in a same pattern with respect to each of the plurality of chip-mounting substrates, and each of the plurality of interlayer connecting wirings are formed in patterns such that a first electric connection state of the plurality of terminals for signals each other between the semiconductor chips each mounted on the chip-mounting substrates, or a second electric connection state between a plurality of external terminal connecting wirings electrically connected to a plurality of predetermined external terminals and each of the plurality of terminals for signals can be switched.

Moreover, according to one aspect of the present invention, there is provided a laminated-chip semiconductor device comprising: a semiconductor chip having predetermined terminals for signals; a plurality of chip-mounting materials on each of which at least one the semiconductor chip is mounted, and which are laminated in two or more layers in a thickness direction; a plurality of chip connecting via terminals provided through each of the plurality of chip-mounting materials in the thickness direction; a plurality of chip connecting wirings which are formed in each of the plurality of chip-mounting materials, and electrically connected to the terminals for signals of the semiconductor chips which are mounted on each of the plurality of chip-mounting materials; a plurality of intermediate materials arranged alternately with each of the plurality of chip-mounting materials along a laminate direction of each of the plurality of chip-mounting materials; a plurality of interlayer connecting via terminals which are provided through the intermediate materials in the thickness direction, and electrically connected to the chip connecting wirings of the chip-mounting materials adjacent on one side; and a plurality of interlayer connecting wirings which are formed in predetermined patterns for each of layers in the intermediate materials so as to electrically connect the interlayer connecting via terminals to the predetermined chip connecting via terminals of the chip-mounting material adjacent on an other side.

Furthermore, according to one aspect of the present invention, there is provided a laminated-chip semiconductor device comprising: two chip-mounting substrates on each of which at least one semiconductor chip having a plurality of terminals for signals is mounted, and a plurality of chip connecting wirings electrically connected to the terminals for signals of the each semiconductor chip which are mounted on the chip-mounting substrates are formed in a same pattern, and which are laminated along a thickness direction; a first intermediate substrate which is arranged between the two chip-mounting substrates, and in which a plurality of interlayer connecting wirings electrically connected to each of the plurality of chip connecting wirings of the adjacent chip-mounting substrates are formed in a predetermined wiring pattern; and a second intermediate substrate which is laminated and arranged alternately with the first intermediate substrate with respect to the chip-mounting substrates, and in which a plurality of interlayer connecting wirings electrically connected to the chip connecting wirings of the adjacent chip-mounting substrate are formed in a wiring pattern different from the wiring pattern of the interlayer connecting wirings formed on the first intermediate substrate.

Additionally, according to one aspect of the present invention, there is provided a laminated-chip semiconductor device comprising: two chip-mounting substrates on each of which at least one semiconductor chip having a plurality of terminals for signals is mounted, and a plurality of chip connecting wirings electrically connected to the terminals for signals of the each semiconductor chip which are mounted on the chip-mounting substrates are formed in a same pattern, and which are laminated along a thickness direction; and one intermediate substrate which is arranged between the two chip-mounting substrates, and in which a plurality of interlayer connecting wirings electrically connected to each of the plurality of chip connecting wirings of the adjacent chip-mounting substrate are formed in a predetermined wiring pattern.

BRIEF DESCRIPTION OF THE SEVERAL VIEWS OF THE DRAWING

FIG. 3 is a plan view of a chip-mounting substrate of the semiconductor device according to one embodiment of the present invention as viewed from a side on which a chip connecting wiring is formed.

FIG. 10 is a plan view showing a ball layer substrate of the semiconductor device according to one embodiment of the present invention as viewed from a side on which a wiring for connecting an external terminal is formed.

FIG. 11 is a block diagram schematically showing a whole constitution of a memory chip of the semiconductor device according to one embodiment of the present invention.

DETAILED DESCRIPTION OF THE INVENTION

A semiconductor device according to one embodiment of the present invention will be described hereinafter with reference to FIGS. 1 to 16.

Figure 2:
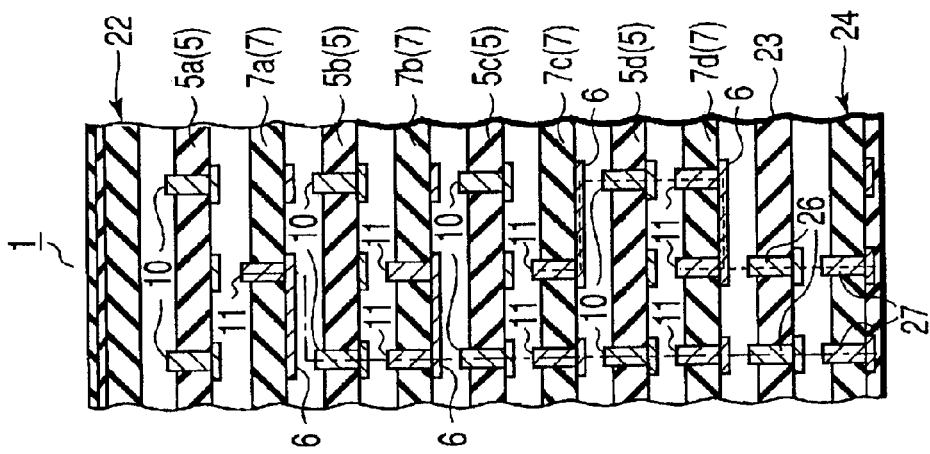
FIG. 2 is a sectional view showing the laminate structure in the vicinity of a chip selector pin in the semiconductor device according to one embodiment of the present invention.
Figure 1:
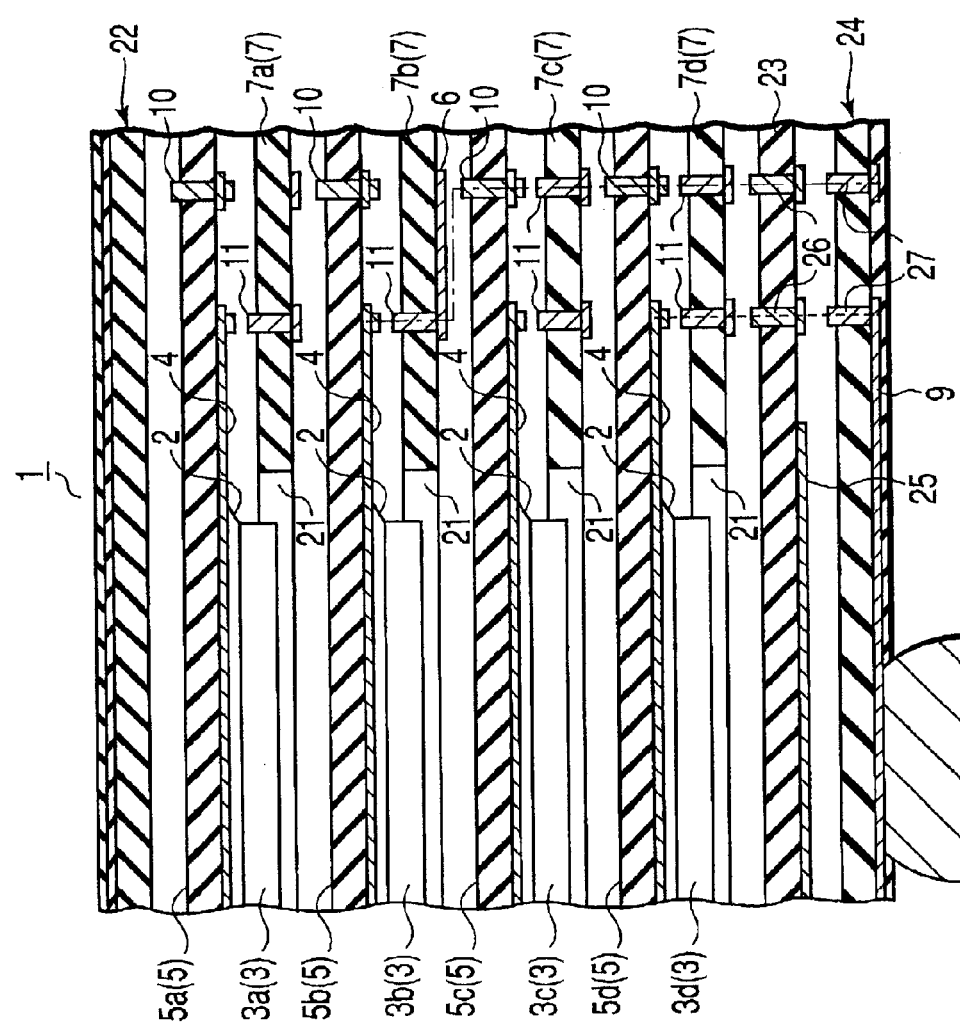
FIG. 1 is a sectional view showing a laminate structure in the vicinity of a semiconductor chip and data pin in a semiconductor device according to one embodiment of the present invention.
Figure 12:
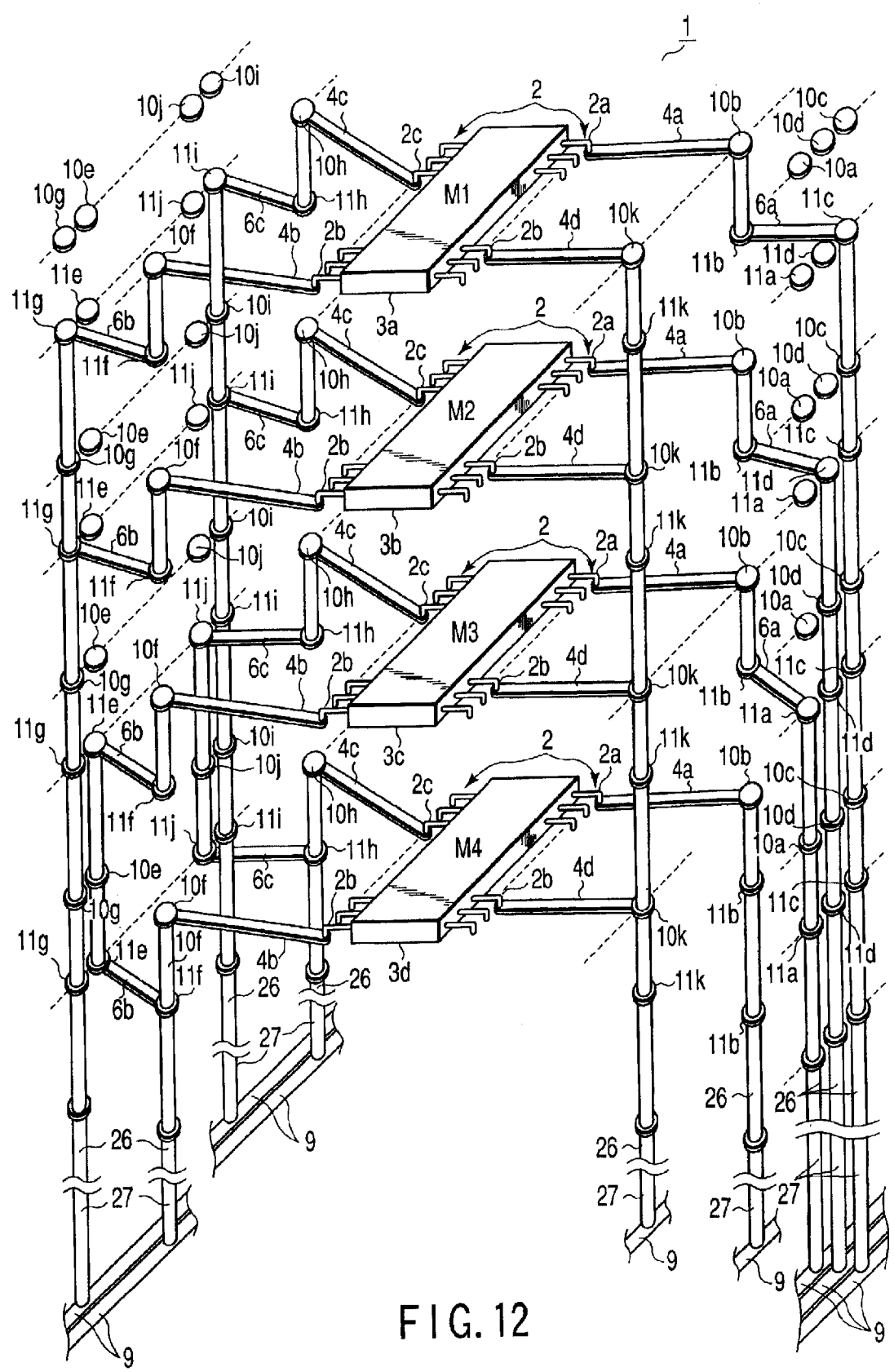
FIG. 12 is a perspective view schematically showing a wiring state of a terminal for signal of the memory chip of the semiconductor device according to one embodiment of the present invention.

FIGS. 1 and 2 are explanatory views of a laminate structure of a semiconductor device 1 of a laminated-chip type according to the present embodiment, FIG. 1 is a sectional view showing the vicinity of a semiconductor chip 3 of each layer of the semiconductor device 1, and FIG. 2 is a sectional view showing the vicinity of a chip selector pin 10 of the layer. Moreover, FIGS. 3 to 10 are plan views showing wiring patterns of respective substrates 5a to 5d, 7a to 7d, 22, 23, 24 of the semiconductor device 1. Furthermore, FIG. 11 is a block diagram schematically showing the constitution of the semiconductor chip 3. Additionally, FIG. 12 is a perspective view schematically showing a wiring state between the layers of terminals for signals of the semiconductor chip 3. Moreover, FIGS. 13 to 16 are plan views schematically showing the connection states of the semiconductor chips 3, chip-mounting substrates 5a to 5d, and intermediate substrates 7a to 7d at the respective layers of the semiconductor device 1.

First, characteristics of respective memory chips 3 as a plurality of semiconductor chips of the semiconductor device 1 will be briefly described with reference to FIG. 11, prior to description of the whole semiconductor device 1. Moreover, a package 12 generally called a multi-chip package or a multi-memory chip package constituted by combining the chips 3 will be briefly described.

In the package 12 of the present embodiment, for example, four DRAM chips 3 each having a capacity of 256 M bits are used as a plurality of memory chips. In the following description, as shown in FIG. 11, the respective DRAM chips 3 will be referred to as an M1 chip 3a, M2 chip 3b, M3 chip 3c, and M4 chip 3d. Each of the M1 to M4 chips 3a to 3d is disposed at each of first to fourth layers of the semiconductor device 1 as described later.

Each of the M1 to M4 chips 3a to 3d has 16 terminals for data 2a. Each of terminals DQ0 to DQ15 is assigned beforehand to each of the 16 terminals for data 2a of the M1 chip 3a. Similarly, each of terminals DQ16 to DQ31 is assigned beforehand to each of the 16 terminals for data 2a of the M2 chip 3b. Moreover, each of terminals DQ32 to DQ47 is assigned beforehand to each of the 16 terminals for data 2a of the M3 chip 3c. Furthermore, each of terminals DQ48 to DQ63 is assigned beforehand to each of the 16 terminals for data 2a of the M4 chip 3d. Each of the M1 to M4 chips 3a to 3d is represented as (256M×16) according to a notation method for general use in a semiconductor industry. In the present embodiment, all of 64 terminals for data 2a in total of the M1 to M4 chips 3a to 3d are independently and electrically connected to external terminals of the semiconductor device 1, generally called bumps via the terminals DQ0 to DQ63. Additionally, the bumps are omitted in FIG. 11.

Moreover, a plurality of terminals for signals 2 for controlling operations of the chips are provided for each type of signals for each of the M1 to M4 chips 3a to 3d. Concretely, one chip-select pin (CS pin) 2b to which a signal for controlling a reading operation is inputted is provided for each of the M1 to M4 chips 3a to 3d. Similarly, one clock-enable pin (CKE pin) 2c to which a signal for synchronizing operation states of predetermined chips is inputted is provided for each of the M1 to M4 chips 3a to 3d. Furthermore, one clock pin (CLK pin) 2d for inputting a clock signal into the chip is provided for each of the M1 to M4 chips 3a to 3d. Additionally, one raw-address strobe pin (RAS pin) 2e to which a down edge signal is inputted from a CPU (not shown) during starting of the reading operation is provided for each of the M1 to M4 chips 3a to 3d. Moreover, one column-address strobe pin (CAS pin) 2f to which a down edge signal is inputted slightly behind the down edge signal inputted to the RAS pin 2e is provided for each of the M1 to M4 chips 3a to 3d. Furthermore, one write enable pin (WE pin) 2g to which a signal for switching the reading operation of each of the chips 3a to 3d is inputted is provided for each of the M1 to M4 chips 3a to 3d.

Among these pins 2b to 2g, as shown in FIG. 11, the CS pins 2b are divided in two sets for the M1 and M2 chips 3a, 3b, and the M3 and M4 chips 3c, 3d. The two sets of the CS pins 2b are electrically connected to the bumps via a CS1 terminal 13a and CS2 terminal 13b, respectively. Similarly, the CKE pins 2c are also divided in two sets for the M1 and M2 chips 3a, 3b, and the M3 and M4 chips 3c, 3d. The two sets of the CKE pins 2c are electrically connected to the bumps via a CKE1 terminal 14a and CKE2 terminal 14b, respectively.

Moreover, for the CLK pin 2d, all the CLK pins 2d of the M1 to M4 chips 3a to 3d are put together into one. The CLK pins 2d are thus collectively and electrically connected to the bump via a CLK0 terminal 15. Similarly, for the RAS pin 2e, CAS pin 2f, and WE pin 2g, all the RAS pins 2e, CAS pins 2f, or WE pins 2g of the M1 to M4 chips 3a to 3d are unified to one pin of each type. The unified RAS pin 2e, CAS pin 2f, or WE pin 2g is electrically connected to the bump via a RAS terminal 16, CAS terminal 17, or WE terminal 18.

Furthermore, a plurality of terminals for addresses 2h are provided for the M1 to M4 chips 3a to 3d. As shown in FIG. 11, the respective terminals for addresses 2h are put together into one for all the M1 to M4 chips 3a to 3d and electrically connected to the bumps.

According to such setting, among the respective M1 to M4 chips 3a to 3d, the M1 and M2 chips 3a, 3b altogether operate as one DRAM chip 3 represented by (256M×32). Similarly, the M3 and M4 chips 3c, 3d altogether operate as one DRAM chip 3 represented by (256M×32). Therefore, the whole package 12 is set by combining two DRAM chips 3 represented by (256M×32)×2, that is, (512M×32).

Moreover, the package 12 is set such that the signals inputted to the CS1 terminal 13a and CS2 terminal 13b, and the CKE1 terminal 14a and CKE2 terminal 14b can be appropriately switched. Therefore, when the signals having predetermined states are independently inputted to the terminals 13a, 13b, 14a, 14b, the DRAM chip 3 including the M1 chip 3a and M2 chip 3b, and the DRAM chip 3 including the M3 chip 3c and M4 chip 3d are simultaneously operated or stopped, or only one DRAM chip is operated. Furthermore, for example, when the CS1 terminal 13a and CS2 terminal 13b are electrically connected to one terminal in the package 12, the whole package 12 can operates as one DRAM chip 3 represented by (1G×64).

The semiconductor device 1 including the package 12 will be next described with reference to FIGS. 1 to 16.

As shown in FIGS. 1 and 2, the semiconductor device 1 has a multi-layered structure in which four M1 to M4 DRAM chips 3a to 3d are divided and laminated in four layers. The semiconductor device 1 is generally called a laminated semiconductor package. Particularly, since each semiconductor chip 3 is the DRAM chip, the semiconductor device is concretely referred to as the DRAM module 1. Additionally, in FIGS. 3 to 10, a portion shown by an outer two-dot chain line of double two-dot chain lines indicates an outer shape 20 of the package.

To constitute the multi-layered structure, the DRAM module 1 includes a plurality of chip-mounting materials 5 as chip-mounting substrates with the M1 to M4 DRAM chips 3a to 3d mounted thereon, or four chip-mounting materials in the present embodiment. In general, the chip-mounting substrate indicates a substrate including the chip-mounting material, and a chip connecting wiring 4 and chip connecting via terminal 10 provided for the material. However, in the present embodiment, when the chip-mounting substrate is assumed to substantially indicate the chip-mounting material, the scope of the present invention is not influenced. Therefore, in the following description, unless mentioned otherwise, the chip-mounting material is denoted with a reference numeral 5, and the chip-mounting material 5 is used in the description. Additionally, a method of the description is similar to that of description of an intermediate material described later.

In the present embodiment, a so-called paper-thin package (PTP) substrate formed to be remarkably thin is used in the chip-mounting material 5 as a packaged substrate. The PTP substrates 5 are laminated four layers along a thickness direction. Moreover, each of four M1 to M4 DRAM chips 3a to 3d is mounted on the chip-mounting material 5. In the following description, the respective PTP substrates 5 disposed at the first to fourth layers are referred to as first to fourth PTP substrates 5a to 5d. The M1 chip 3a is mounted on the first PTP substrate 5a disposed at the first layer. Similarly, the M2 chip 3b is mounted on the second PTP substrate 5b disposed at the second layer. Moreover, the M3 chip 3c is mounted on the third PTP substrate 5c disposed at the third layer. Furthermore, the M4 chip 3d is mounted on the fourth PTP substrate 5d disposed at the fourth layer. The M1 to M4 DRAM chips 3a to 3d are mounted on a chip-mounting region 19 shown by the inner two-dot chain line in FIG. 3 with respect to the first to fourth PTP substrates 5a to 5d by a flip chip method.

As shown in FIG. 3, a plurality of chip connecting wirings 4 electrically connected to the terminals for signals 2 of the M1 to M4 DRAM chips 3a to 3d are all formed in the same wiring pattern on main surfaces of the first to fourth PTP substrates 5a to 5d. Moreover, the PTP substrates 5a to 5d include a plurality of chip connecting via terminals 10 individually and electrically connected to the terminals for signals 2 of the DRAM chips 3a to 3d. The same predetermined number of chip connecting via terminals 10 are formed on the same predetermined position on the PTP substrates 5a to 5d. Therefore, in the present embodiment, all the first to fourth PTP substrates 5a to 5d have the same structure. Each terminal for signal 2 of each of the DRAM chips 3a to 3d is electrically connected to the chip connecting via terminal 10 via the chip connecting wiring 4.

Many of the chip connecting via terminals 10 are provided through the PTP substrates 5a to 5d in the thickness direction, but some of the terminals do not have a via plug passed through each of the PTP substrates 5a to 5d in the thickness direction. In FIG. 3, the chip connecting via terminal 10 having no via plug and having only a via land formed as an end is shown by a white single circle, and the chip connecting via terminal 10 having the via plug is shown by a white double circle.

For example, at the first PTP substrate 5a, four chip connecting via terminals 10 are provided for each of 16 DQ0 to DQ15 terminals for data 2a provided for the M1 chip 3a. Moreover, three chip connecting via terminals 10 are provided for one CS pin 2b provided for the M1 chip 3a. Furthermore, three chip connecting via terminals 10 are provided for one CKE pin 2c of the M1 chip 3a. Additionally, one chip connecting via terminal 10 is provided for one CLK pin 2d of the M1 chip 3a. The terminal for data 2a, CS pin 2b, CKE pin 2c, and CLK pin 2d are electrically connected to the predetermined chip connecting via terminals 10 via the predetermined chip connecting wirings 4 described later.

As shown in FIG. 1, the first to fourth PTP substrates 5a to 5d also include a large number of chip connecting via terminals 10 which are not electrically connected to the chip connecting wirings 4 on the chip-mounting material and are electrically connected to external terminal connecting wirings 9 described later along the laminate direction. Among the respective chip connecting via terminals 10, the chip connecting via terminal 10 assigned to a conductive path extending along the laminate direction of the terminals for signals 2 of the M1 to M4 DRAM chips 3a to 3d and the external terminal connecting wirings 9 described later is provided through the chip-mounting material as a substrate main body of each of the PTP substrates 5a to 5d in the thickness direction.

Four chip connecting via terminals 10 are provided for each of 16 terminals for data (pins for data) 2a at the first PTP substrate 5a. On the other hand, only three chip connecting via terminals 10 are provided for one CS pin 2b and one CKE pin 2c. Moreover, only one chip connecting via terminal 10 is provided for one CLK pin 2d. This is because of the setting of the aforementioned memory constitution.

Since all the 16 terminals for data 2a need to be independently connected to external terminals 8, the conductive path needs to be switched in each of the first to fourth layers in order to prevent the terminals from being electrically connected to one another. Therefore, it is a necessary and sufficient condition to provided four chip-connecting via terminals 10 for each of 16 terminals for data 2a. On the other hand, three chip-connecting via terminals 10 are provided for the CS pin 2b and CKE pin 2c. This is because the CS pin 2b and CKE pin 2c are combined in two sets for the first and second layers, and the third and fourth layers. Moreover, since all the CLK pins 2d are arranged in one conductive path in the first to fourth layers, one chip connecting via terminal 10 is sufficient.

As described above, the number of chip connecting via terminals 10 can be easily changed and set to a necessary and sufficient number for each type of signal in accordance with a desired memory constitution in the DRAM module 1 of the present embodiment.

A relation between the M1 to M4 DRAM chips 3a to 3d and the first to fourth PTP substrates 5a to 5d will be next described. As described above, the M1 to M4 DRAM chips 3a to 3d and the first to fourth PTP substrates 5a to 5d have the same structure. Therefore, to understand the characteristic of the semiconductor device 1 of the present embodiment, a relation between the M2 to M4 DRAM chips 3b to 3d and the second to fourth PTP substrates 5b to 5d is sufficiently understood by description of a relation between the M1 chip 3a and the first PTP substrate 5a. For example, 16 DQ16 to DQ31 terminals for data 2a of the M2 chip 3b, 16 DQ32 to DQ47 terminals for data 2a of the M3 chip 3c, and 16 DQ48 to DQ63 terminals for data 2a of the M4 chip 3d may be considered with correspondence to 16 DQ0 to DQ15 terminals for data 2a of the M1 chip 3a. Therefore, in the following description, the relation between the M1 chip 3a and the first PTP substrate 5a will be described. The description and illustration of the relation between the M2 to M4 DRAM chips 3b to 3d and the second to fourth PTP substrates 5b to 5d are omitted.

Moreover, in the relation between the M1 chip 3a and the first PTP substrate 5a, the relation between the DQ0 terminal for data 2a as one of 16 DQ0 to DQ15 terminals for data 2a of the M1 chip 3a and the first to fourth DQ0 terminal connecting via terminals 10a to 10d provided for the DQ0 terminal for data 2a may be described. Similarly, a relation between one CS pin 2b of the M1 chip 3a and the first to third CS pin connecting via terminals 10e to 10g provided for the CS pin 2b may be described. Moreover, a relation between one CKE pin 2c of the M1 chip 3a and the first to third CKE pin connecting via terminals 10h to 10j provided for the CKE pin 2c may be described. Furthermore, a relation between one CLK pin 2d of the M1 chip 3a and one CLK pin connecting via terminal 10k provided for the CLK pin 2d may be described. By the description of these relations, among characteristics of the semiconductor device 1 of the present embodiment, a relation between the M1 chip 3a and the first PTP substrate 5a, and a relation between the M1 to M4 DRAM chips 3a to 3d and the first to fourth PTP substrates 5a to 5d can be understood.

Moreover, for the chip connecting wiring 4, descriptions of a DQ0 terminal connecting wiring 4a for electrically connecting the DQ0 terminal for data 2a to the first to fourth DQ0 terminal connecting via terminals 10a to 10d, a CS pin connecting wiring 4b for electrically connecting the CS pin 2b to the first to third CS pin connecting via terminals 10e to 10g, a CKE pin connecting wiring 4c for electrically connecting the CKE pin 2c to the first to third CKE pin connecting via terminals 10h to 10j, and a CLK pin connecting wiring 4d for electrically connecting the CLK pin 2d to the CLK pin connecting via terminal 10k are sufficient.

When the M1 chip 3a is mounted on the first PTP substrate 5a, as shown in FIG. 12, the DQ0 terminal for data 2a of the M1 chip 3a is electrically connected to the second DQ0 terminal connecting via terminal 10b via the DQ0 terminal connecting wiring 4a. Moreover, the CS pin 2b of the M1 chip 3a is electrically connected to the second CS pin connecting via terminal 10f via the CS pin connecting wiring 4b. Furthermore, the CKE pin 2c of the M1 chip 3a is electrically connected to the first CKE pin connecting via terminal 10h via the CKE pin connecting wiring 4c. Additionally, the CLK pin 2d of the M1 chip 3a is electrically connected to the CLK pin connecting via terminal 10k via the CLK pin connecting wiring 4d. In FIG. 3, the aforementioned electric connection state is shown in which the M1 chip 3a is not mounted on the first PTP substrate 5a.

Moreover, in FIG. 12, in order to easily see the drawing and easily understand the electric connection state of the terminals for signals 2 of the M1 chip 3a, illustration of the first to fourth PTP substrates 5a to 5d and intermediate substrate 7 described later is omitted. Furthermore, FIG. 12 shows the chip connecting via terminal 10 in the following method. For example, among the first to fourth DQ0 terminal connecting via terminals 10a to 10d, the presence of the first, third, and fourth DQ0 terminal connecting via terminals 10a, 10c, 10d provided for a portion which does not contribute to the electric connection of the DQ0 terminal for data 2a to the external terminal connecting wiring 9 is shown only by the via land. This also applies to the first to third CS pin connecting via terminals 10e to 10g, first to third CKE pin connecting via terminals 10h to 10j, and CLK pin connecting via terminal 10k.

The intermediate substrate 7 will be next described. In the following description, the intermediate substrate 7, interlayer connecting via terminal 11 provided for the intermediate substrate 7, and interlayer connecting wiring 6 will be described in a similar flow of the first to fourth PTP substrates 5a to 5d, chip connecting via terminal 10, and chip connecting wiring 4.

Similarly as the relation between the chip-mounting substrate and the chip-mounting material, in general, the intermediate substrate indicates an intermediate material including the interlayer connecting wiring 6 and interlayer connecting via terminal 11 provided for the material. However, in the present embodiment, even when the intermediate substrate is assumed to substantially indicate the intermediate material, there is no problem in the scope of the present invention. Therefore, unless especially mentioned in the following description, the intermediate material is denoted with the reference numeral 7, and the intermediate material 7 is used in the description.

As shown in FIGS. 1 and 2, a plurality of intermediate materials 7 are disposed alternately with the first to fourth PTP substrates 5a to 5d along the laminate direction. In the present embodiment, each of four intermediate materials 7 in total is laminated and disposed for each of the first to fourth layers. The intermediate material 7 is constituted of a glass epoxy substrate formed by impregnating a glass cloth with resin, and formed as a type of insulating substrate. Moreover, so-called chip cavities 21 as voids are formed opposite the M1 to M4 DRAM chips 3a to 3d of the intermediate substrate 7 in order to prevent the intermediate materials 7 from interfering with the M1 to M4 DRAM chips 3a to 3d mounted on the PTP substrates 5a to 5d in the laminated state. Furthermore, the thickness of the intermediate material 7 is formed to such an extent that the M1 to M4 DRAM chips 3a to 3d do not contact the adjacent PTP substrates 5b to 5d in the laminate state or a power supply ground substrate 23 described later.

A plurality of interlayer connecting via terminals 11 electrically connected to the terminals for signals 2 of each semiconductor chip 3 mounted on the chip-mounting material 5 are provided through the intermediate material 7 in the thickness direction. The same number of interlayer connecting via terminals 11 as the number of chip connecting via terminals 10 are formed in the intermediate material 7 so as to have a one-to-one correspondence with respect to the chip connecting via terminals 10 provided for first to fourth PTP substrates 5a to 5d adjacent to four intermediate materials 7. Additionally, similarly as the chip connecting via terminals 10, some of the interlayer connecting via terminals 11 have only via lands formed therein, and are shown by white single circles in FIGS. 5 to 8. Moreover, the interlayer connecting via terminals 11 having the via plugs are shown by white double circles. As shown in FIGS. 1 and 2, the interlayer connecting via terminals 11 are formed to be linearly aligned with respect to the chip connecting via terminals 10 along the laminate direction of the PTP substrates 5a to 5d and intermediate substrate 7.

The intermediate material 7 having the aforementioned structure is generally referred to as an interstitial via hall (IVH) substrate 7. In the following description, the respective IVH substrates 7 disposed alternately with the first to fourth PTP substrates 5a to 5d along the laminate direction of the PTP substrates in the first to fourth layers will be referred to as first to fourth IVH substrates 7a to 7d.

Moreover, in the following description, among the interlayer connecting via terminals 11 provided for the first to fourth IVH substrates 7a to 7d, the interlayer connecting via terminals 11 provided correspondingly the first to fourth DQ0 terminal connecting via terminals 10a to 10d in the first PTP substrate 5a will be referred to as first to fourth DQ0 interlayer connecting via terminals 11a to 11d. Similarly, the interlayer connecting via terminals 11 provide correspondingly first to third CS pin connecting via terminals 10e to 10g in the first PTP substrate 5a will be referred to as first to third CS pin interlayer connecting via terminals 11e to 11g. Moreover, the interlayer connecting via terminals 11 provide correspondingly first to third CKE pin connecting via terminals 10h to 10j in the first PTP substrate 5a will be referred to as first to third CKE pin interlayer connecting via terminals 11h to 11j. Furthermore, the interlayer connecting via terminal 11 corresponding the CLK pin connecting via terminal 10k in the first PTP substrate 5a will be referred to as a CLK pin interlayer connecting via terminal 11k.

Additionally, the DQ0 interlayer connecting via terminals 11a to 11d may be also provided to extend through the thickness direction of all the first to fourth IVH substrates 7a to 7d. Moreover, in the present embodiment, the DQ0 interlayer connecting via terminals 11a to 11d are provided for only a position required for the electric connection of the terminals for signals 2 to the external terminal connecting wirings 9, and are not provided for a position unnecessary for the connection. Therefore, similarly as the chip connecting via terminal 10, in FIGS. 1, 5 to 8, and 12, the via lands of the DQ0 interlayer connecting via terminals 11a to 11d are shown in the position which does not contribute to the electric connection of the terminal for signal 2 to the external terminal connecting wiring 9. This also applies to the first to third CS pin interlayer connecting via terminals 11e to 11g, first to third CKE pin interlayer connecting via terminals 11h to 11j, and CLK pin interlayer connecting via terminal 11k.

On the other hand, when the interlayer connecting via terminals 11 are provided to extend through the first to fourth IVH substrates 7a to 7d along the thickness direction, it is possible to reduce a restriction on the wiring with respect to a laminate order during laminating of a plurality of system blocks. For the system block, a set of the semiconductor chip 3, chip-mounting material 5, and intermediate material 7 is constituted as one unit. Moreover, similarly as the chip connecting via terminals 10, the number of interlayer connecting via terminals 11 may be set for each type of signal in accordance with the desired memory constitution.

Figure 5:
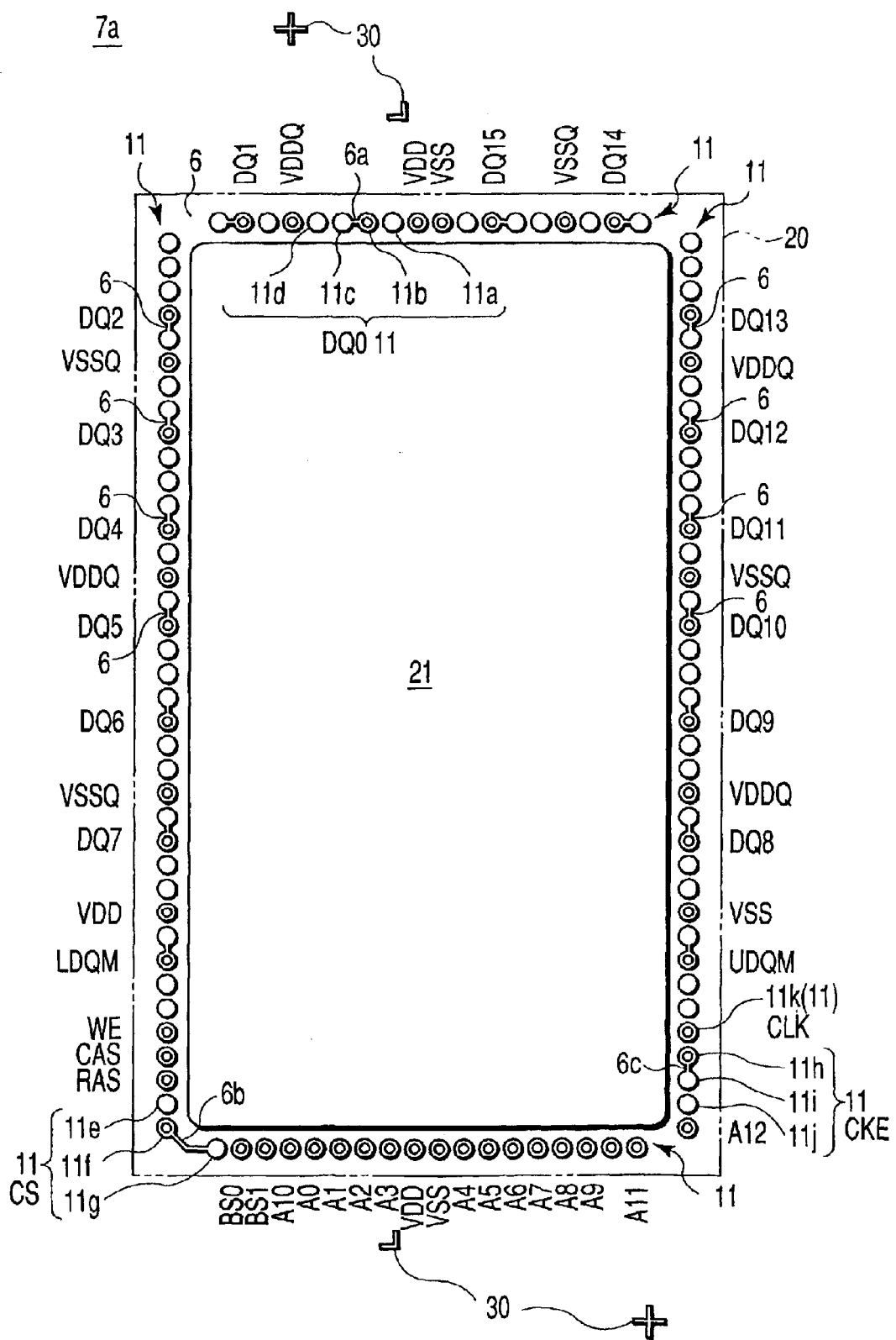
FIG. 5 is a plan view showing a first intermediate substrate of the semiconductor device according to one embodiment of the present invention as viewed from a side on which an interlayer connecting wiring is formed.

At the first IVH substrate 7, as shown in FIG. 5, the second DQ0 interlayer connecting via terminal 11b is electrically connected to the third DQ0 interlayer connecting via terminal 11c via the DQ0 interlayer connecting wiring 6a among the interlayer connecting wirings 6. Moreover, the second CS pin interlayer connecting via terminal 11f is electrically connected to the third CS pin interlayer connecting via terminal 11g via the CS pin interlayer connecting wiring 6b. Furthermore, the first CKE pin interlayer connecting via terminal 11h is electrically connected to the second CKE pin interlayer connecting via terminal 11i via the CKE pin interlayer connecting wiring 6c. Only one CLK pin connecting via terminal 11k is provided, and is not connected to the interlayer connecting wiring 6. This also applies to the first to fourth IVH substrates 7a to 7d.

Figure 6:
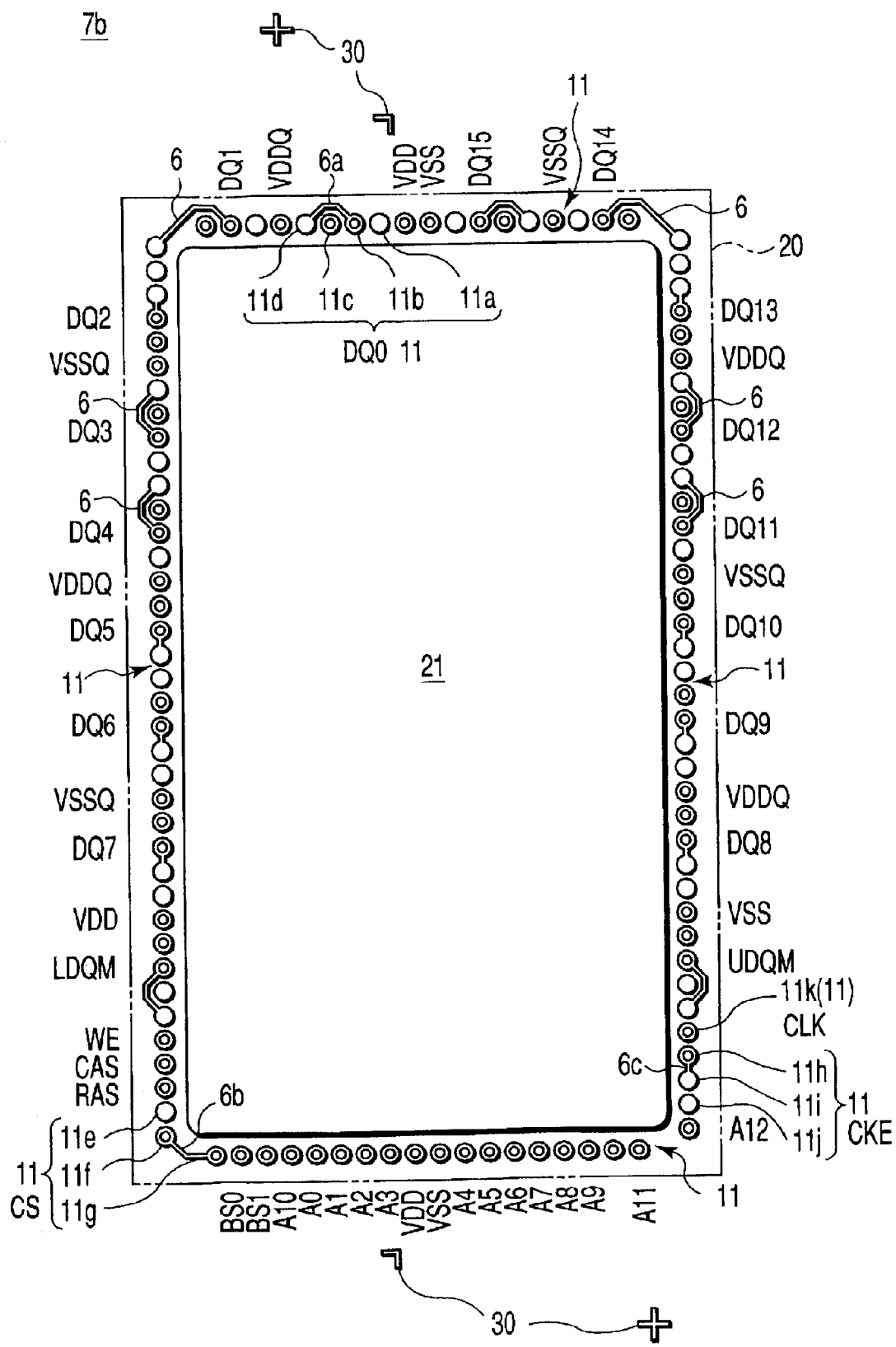
FIG. 6 is a plan view showing a second intermediate substrate of the semiconductor device according to one embodiment of the present invention as viewed from the side on which the interlayer connecting wiring is formed.

Furthermore, at the second IVH substrate 7b, as shown in FIG. 6, the second DQ0 interlayer connecting via terminal 11b is electrically connected to the fourth DQ0 interlayer connecting via terminal lid via the DQ0 interlayer connecting wiring 6a. Additionally, the second CS pin interlayer connecting via terminal 11f is electrically connected to the third CS pin interlayer connecting via terminal 11g by the CS pin interlayer connecting wiring 6b. Moreover, the first CKE pin interlayer connecting via terminal 11h is electrically connected to the second CKE pin interlayer connecting via terminal 11i via the CKE pin interlayer connecting wiring 6c.

Figure 7:
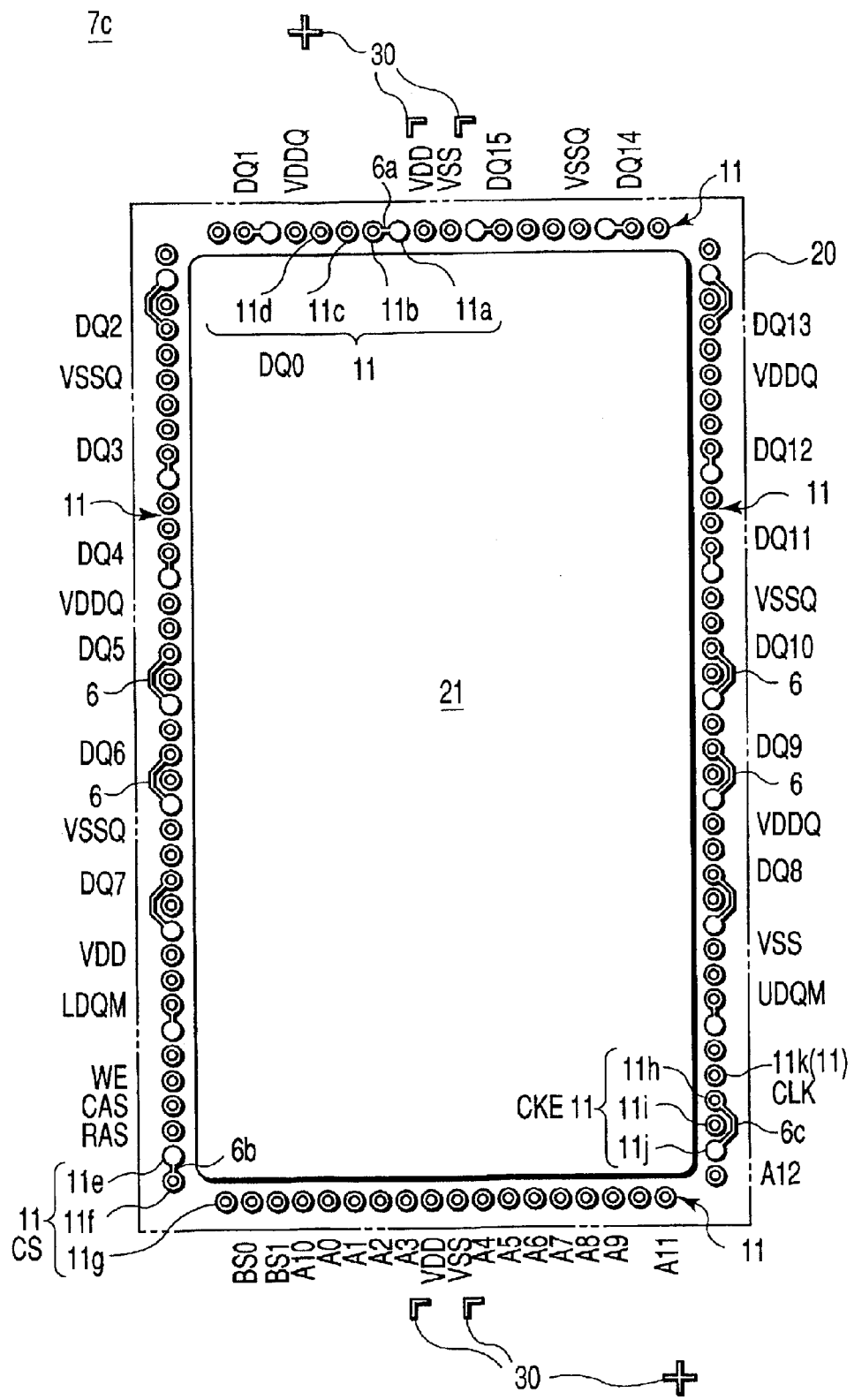
FIG. 7 is a plan view showing a third intermediate substrate of the semiconductor device according to one embodiment of the present invention as viewed from the side on which the interlayer connecting wiring is formed.

Additionally, at the third IVH substrate 7a, as shown in FIG. 7, the second DQ0 interlayer connecting via terminal 11b is electrically connected to the first DQ0 interlayer connecting via terminal 11a via the DQ0 interlayer connecting wiring 6a. Additionally, the second CS pin interlayer connecting via terminal 11f is electrically connected to the first CS pin interlayer connecting via terminal 11e by the CS pin interlayer connecting wiring 6b. Moreover, the first CKE pin interlayer connecting via terminal 11h is electrically connected to the third CKE pin interlayer connecting via terminal 11j by the CKE pin interlayer connecting wiring 6c.

Figure 8:
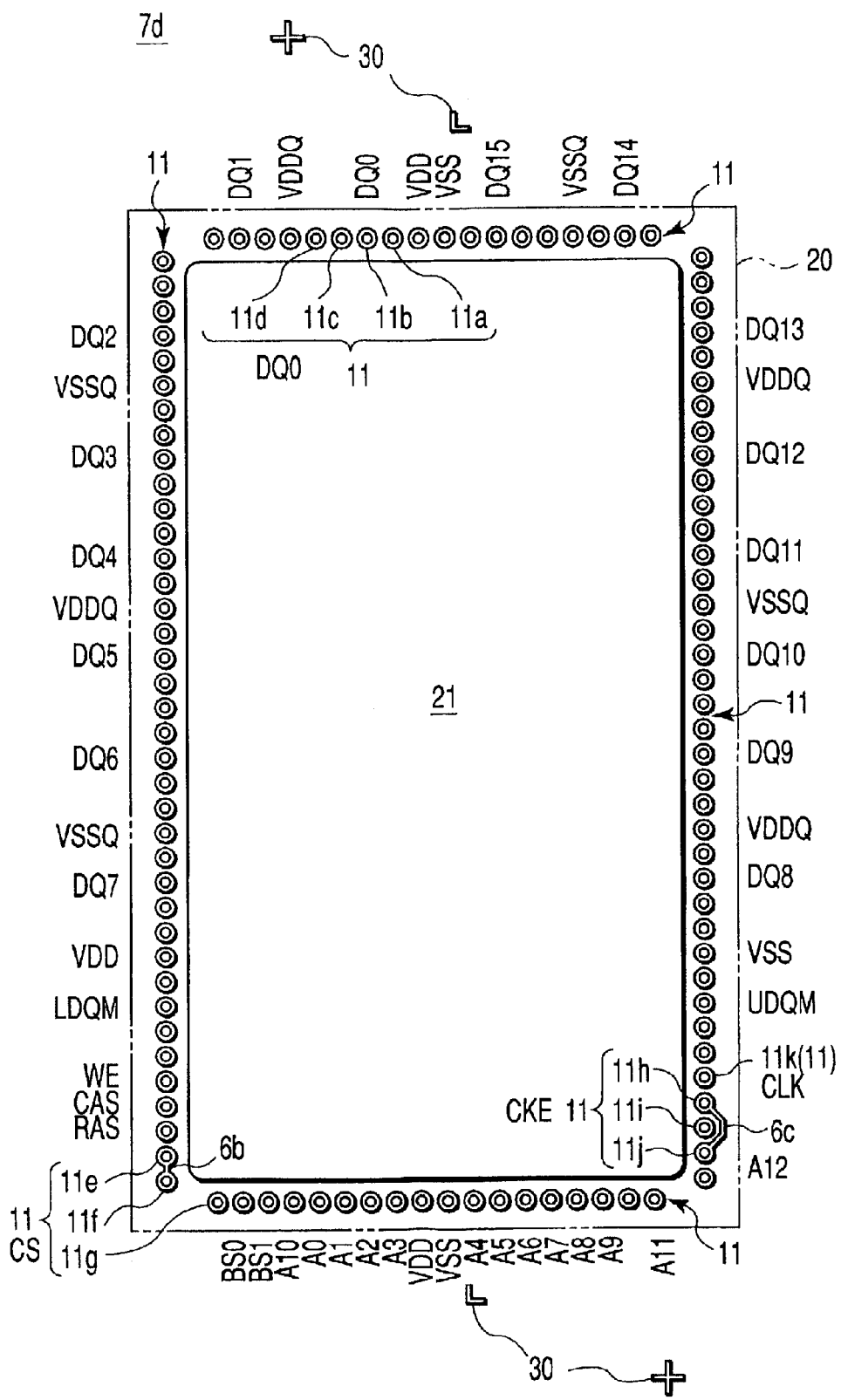
FIG. 8 is a plan view showing a fourth intermediate substrate of the semiconductor device according to one embodiment of the present invention as viewed from the side on which the interlayer connecting wiring is formed.

Moreover, at the fourth IVH substrate 7a, as shown in FIG. 8, the second DQ0 interlayer connecting via terminal 11b is not electrically connected to any one of the other DQ0 interlayer connecting via terminals 11a, 11c, 11d. Additionally, the second CS pin interlayer connecting via terminal 11f is electrically connected to the first CS pin interlayer connecting via terminal 11e by the CS pin interlayer connecting wiring 6b. Moreover, the first CKE pin interlayer connecting via terminal 11h is electrically connected to the third CKE pin interlayer connecting via terminal 11j by the CKE pin interlayer connecting wiring 6c.

As shown in FIGS. 1 and 2, the first to fourth IVH substrates 7a to 7d constituted as described above are alternately arranged with respect to the first to fourth PTP substrates 5a to 5d along the laminate direction. Thereby, as shown in FIG. 12, a main part of the DRAM module 1 formed of a four-layers structure is assembled. In this state, as shown by a broken line or a one-dot chain line in FIGS. 1 and 2, the terminals for signals 2 of the M1 to M4 DRAM chips 3a to 3d are electrically connected to the external terminal 8 independently for the terminals of the layers in a predetermined wiring state.

The wiring pattern for electrically connecting the DQ0 terminals for data 2a of the first to fourth DRAM chips 3a to 3d to the first to fourth PTP substrates 5a to 5d and first to fourth IVH substrates 7a to 7d will be briefly described with reference to FIGS. 13 to 16.

FIGS. 13 to 16 schematically show the constitutions of the first to fourth layers of the DRAM module 1. In FIGS. 13 to 16, the inner two-dot chain line indicates the first to fourth PTP substrates 5a to 5d, and the outer two-dot chain line indicates the first to fourth IVH substrates 7a to 7d. Moreover, in FIGS. 13 to 16, the PTP substrates 5a to 5d are shown deviating from the IVH substrates 7a to 7d, so that the wiring state between the first to fourth DQ0 terminal connecting via terminals 10a to 10d and the first to fourth DQ0 interlayer connecting via terminals 11a to 11d can be easily understood. Furthermore, in FIGS. 13 to 16, the electric connections between the DQ0 terminal connecting via terminals 10a to 10d and the first to fourth DQ0 interlayer connecting via terminals 11a to 11d along the laminate direction is shown by broken lines.

In the DRAM module 1, as shown in FIGS. 13 to 16, all the DQ0 terminals for data 2a of the first to fourth DRAM chips 3a to 3d are electrically connected to the second DQ0 terminal connecting via terminal 10b via the DQ0 terminal connecting wiring 4a formed in the same wiring pattern on the PTP substrates 5a to 5d. Moreover, the second DQ0 terminal connecting via terminal 10b is electrically connected to the second DQ0 interlayer connecting via terminal 11b continuously provided along the laminate direction. For these connection states, the second DQ0 interlayer connecting via terminal 11b is electrically connected to the other DQ0 interlayer connecting via terminals 11c, 11d, 11a which differ with the respective layers except the fourth layer.

Concretely, the second DQ0 interlayer connecting via terminal 11b of the first layer is electrically connected to the third DQ0 interlayer connecting via terminal 11c via the DQ0 interlayer connecting wiring 6a. Moreover, the second DQ0 interlayer connecting via terminal 11b of the second layer is electrically connected to the fourth DQ0 interlayer connecting via terminal 11d via the DQ0 interlayer connecting wiring 6a. Furthermore, the second DQ0 interlayer connecting via terminal 11b of the third layer is electrically connected to the first DQ0 interlayer connecting via terminal 11a via the DQ0 interlayer connecting wiring 6a. Additionally, only the second DQ0 interlayer connecting via terminal 11b of the fourth layer extends toward the external terminal 8 (not shown) as such without using the DQ0 interlayer connecting wiring 6a.

In this manner, in the present embodiment, the wiring pattern of the DQ0 interlayer connecting wiring 6a is formed in a shape which differs with the first to fourth IVH substrates 7a to 7d. Therefore, even when all the DQ0 terminal connecting wirings 4a formed on the first to fourth PTP substrates 5a to 5d are formed in the same wiring pattern, the DQ0 terminals for data 2a of the first to fourth DRAM chips 3a to 3d can be independently and electrically connected to the different external terminals 8.

Moreover, as shown in FIGS. 5 to 8 and 12, the CS pins 2b of the DRAM chips 3a to 3d of the respective layers are electrically connected to the second CS pin interlayer connecting via terminal 11f among three interlayer connecting via terminals 11 arranged on each of the first to fourth IVH substrates 7a to 7d. Thereby, the CS pins 2b of the layers are divided into two sets of the first and second layers, and the third and fourth layers as shown by a broken line or a one-dot chain line in FIG. 2, and individually and electrically connected to the external terminal 8 for each set. Additionally, in FIG. 2, the connection state between the CS pin 2b and the second CS pin interlayer connecting via terminal 11f is omitted. In this manner, in the DRAM module 1, the CS pins 2b of the DRAM chips 3a to 3d are grouped into two sets for the M1 and M2 chips 3a, 3b, and for the M3 and M4 chips 3c, 3d, and satisfy a memory constituting condition that the CS pins are electrically connected to the external terminal 8 via the CS1 terminal 13a and CS2 terminal 13b. Moreover, in the DRAM module 1, as shown in FIG. 12, the memory constituting condition is satisfied with respect to the other terminals for signals 2.

Furthermore, in the DRAM module 1, the interlayer connecting wirings 6 provided for the first to fourth IVH substrates 7a to 7d are formed in different wiring patterns as described above. In such setting, for example, the IVH substrate 7a of the first layer is used as a first intermediate substrate or material, and the IVH substrate 7b of the second layer is regarded as a second intermediate substrate or material. Moreover, the IVH substrate 7c of the third layer is regarded as a third intermediate substrate or material, and the IVH substrate 7d of the fourth layer can be regarded as a fourth intermediate substrate or material. In this manner, the DRAM module 1 includes at least two intermediate substrates 7 of the first intermediate substrate 7a and second intermediate substrate 7b in which the interlayer connecting wirings 6 formed in different wiring patterns are formed.

Particularly, for the intermediate substrate 7 disposed between two predetermined chip-mounting substrates 5, a plurality of interlayer connecting wirings 6 provided for the intermediate substrate 7 are electrically connected to the chip connecting wiring 4 of the adjacent chip-mounting substrate 5. The conductive path of the terminals for signals 2 of the semiconductor chip 3 mounted on the chip-mounting substrate 5 is formed in the wiring pattern which can be set in different paths in the laminate direction.

Figure 4:
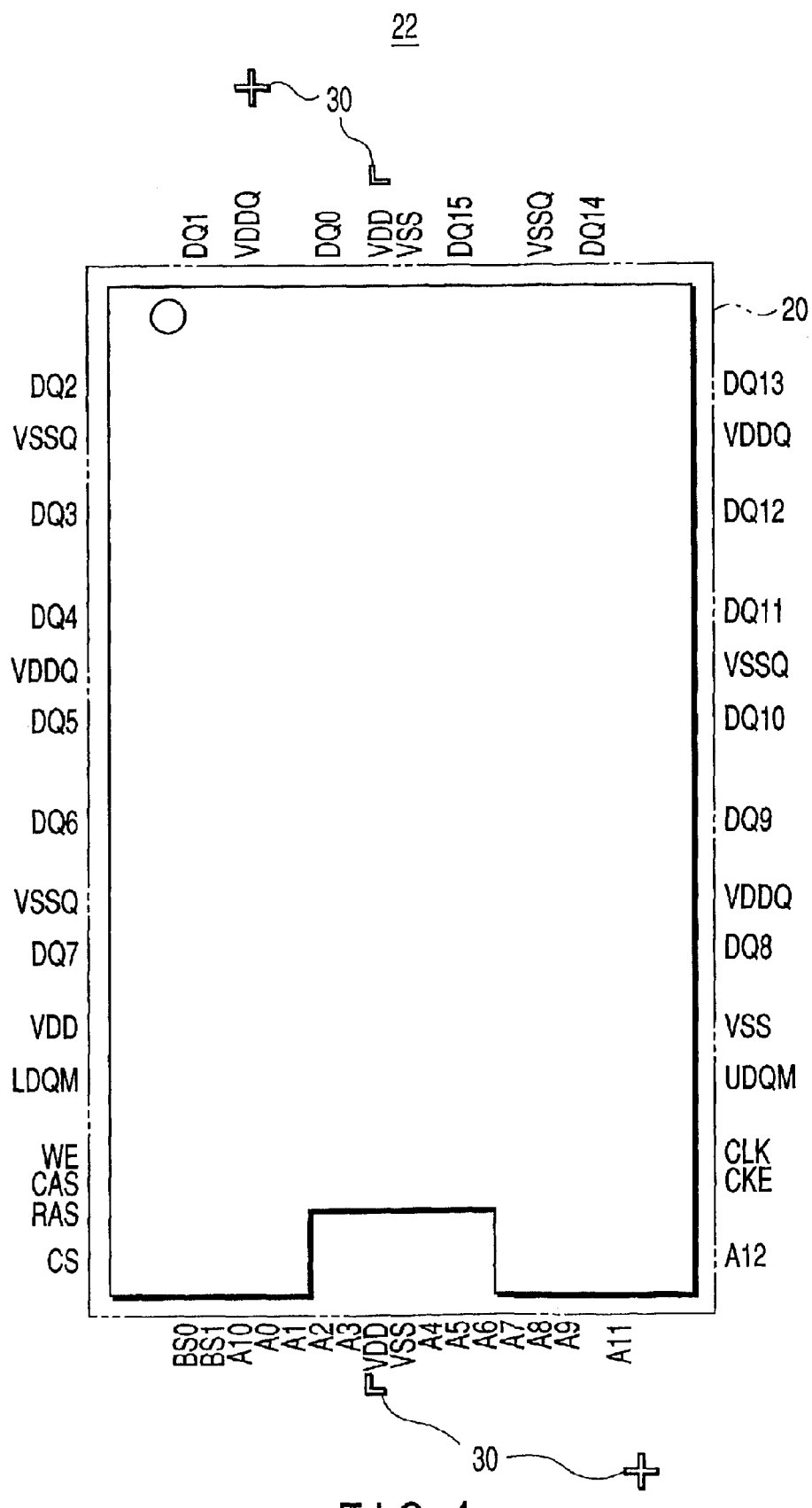
FIG. 4 is a plan view showing a surface substrate of the semiconductor device according to one embodiment of the present invention as viewed from below.

As shown in FIGS. 1 and 2, in the DRAM module 1, a surface substrate 22 as a 0 layer substrate structured as shown in FIG. 4 is provided on an upper side (front surface side) as one side of the laminate direction. As shown in FIG. 1, the surface substrate 22 is formed in a three-layers structure of an insulating material, and prevents a short-circuit of the DRAM module 1. Additionally, the surface substrate also has a function of protecting an inner structure of the DRAM module 1, particularly four DRAM chips 3a to 3d from an impact applied from the outside.

Figure 9:
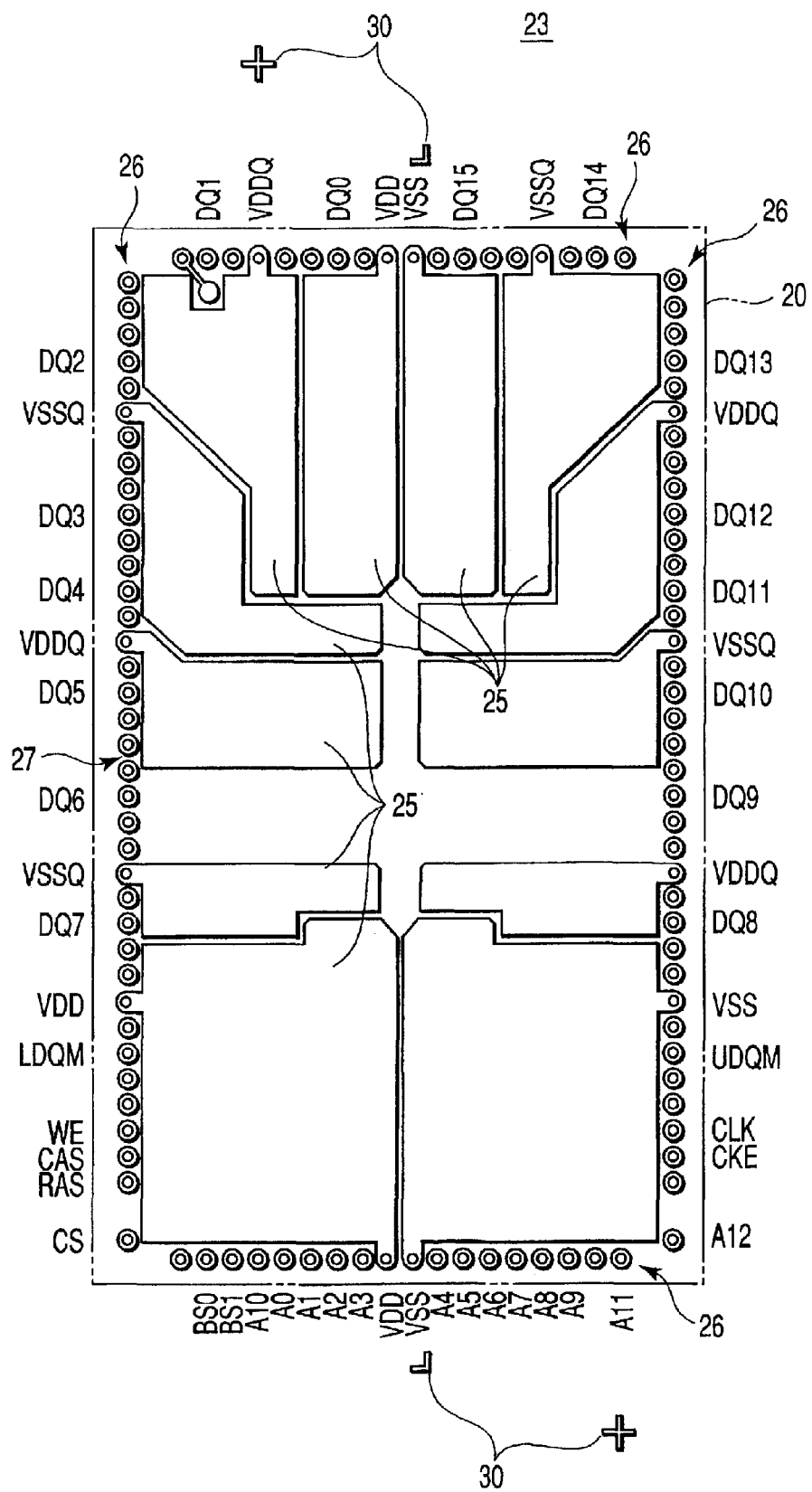
FIG. 9 is a plan view showing a power supply ground substrate of the semiconductor device according to one embodiment of the present invention as viewed from a side on which a wiring for a power supply ground is formed.

Moreover, as shown in FIGS. 1 and 2, in the DRAM module 1, a power supply ground substrate 23 as a fifth layer substrate is provided on a lower side (back surface side) as the other side of the laminate direction. In the power supply ground substrate 23, as shown in FIG. 9, a plurality of power supply grounding wirings 25 are provided for predetermined wiring patterns, and a surface area of the wiring is formed to be remarkably broader than that of the chip connecting wiring 4 and the interlayer connecting wiring 6. Since the surface area of the power supply grounding wiring 25 is formed to be remarkably broader than that of the chip connecting wiring 4 and interlayer connecting wiring 6, an electric noise generated in the DRAM module 1 can be effectively suppressed or removed.

Moreover, at the power supply ground substrate 23, a plurality of power supply ground substrate via terminals 26 for electrically connecting the terminals for signals 2 of the DRAM chips 3a to 3d to the external terminal connecting wiring 9 are provided through the thickness direction. In the present embodiment, substantially the same number of power supply ground substrate via terminals 26 as the number of chip connecting via terminals 10 or interlayer connecting via terminals 11 are provided. Additionally, among the terminals for signals 2 of the M1 to M4 DRAM chips 3a to 3d, the terminals for signals 2 other than the terminals electrically connected to the power supply grounding wiring 25 via the power supply ground substrate via terminal 26 are simply connected only to the power supply ground substrate via terminals 26 so that the conductive path extending along the laminate direction is secured.

Furthermore, in the DRAM module 1, as shown in FIGS. 1 and 2, one ball layer substrate 24 as a sixth layer substrate is further provided under the power supply ground substrate 23. At the ball layer substrate 24, as shown in FIG. 10, a plurality of external terminal connecting wirings 9 for electrically connecting the terminals for signals 2 of the DRAM chips 3a to 3d to the external terminals 8 described later are provided for the predetermined wiring patterns. As shown in FIG. 1, the external terminal connecting wiring 9 is electrically connected to the external terminal 8 provided on the back surface of the ball layer substrate 24. A plurality of external terminals 8 is usually provided, but FIG. 1 shows only one external terminal.

Additionally, at the ball layer substrate 24, a plurality of external terminal connecting via terminals 27 electrically connected to the power supply ground substrate via terminals 26 and external terminal connecting wirings 9 are provided through the thickness direction. Thereby, the terminals for signals 2 of the DRAM chips 3a to 3d can be electrically connected to the external terminals 8. In the present embodiment, substantially the same number of external terminal connecting via terminals 27 as the number of chip connecting via terminals 10, interlayer connecting via terminals 11, or power supply ground substrate via terminals 26 are provided.

For example, as shown in FIG. 12, the terminals for signals 2 of the DRAM chips 3a to 3d are set to predetermined wiring states inside the DRAM module 1, and electrically connected to the power supply ground substrate via terminals 26 and external terminal connecting via terminals 27. Moreover, the terminals for signals 2 are electrically connected to the external terminals 8 via the external terminal connecting wirings 9.

Figure 13:
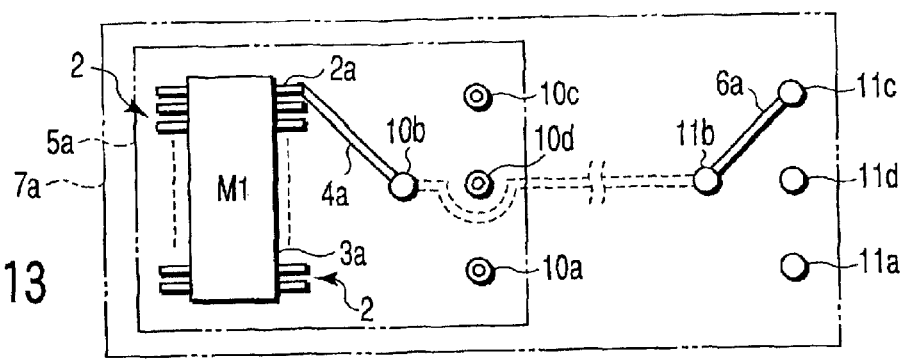
FIG. 13 is a plan view schematically showing a connection state of the memory chip, chip-mounting substrate, and first intermediate substrate of the semiconductor device according to one embodiment of the present invention.
Figure 14:
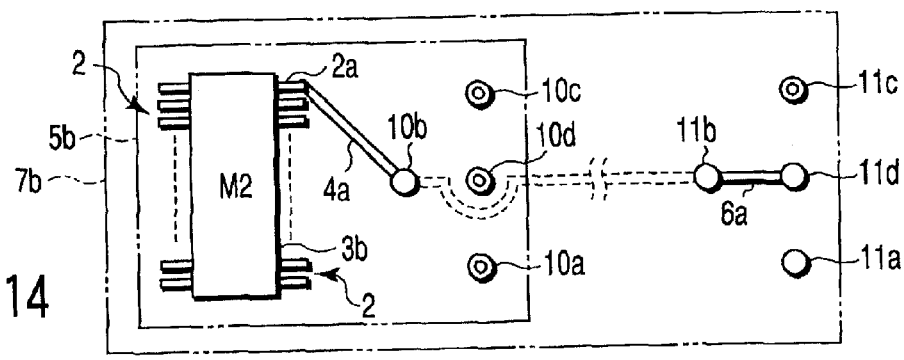
FIG. 14 is a plan view schematically showing a connection state of the memory chip, chip-mounting substrate, and second intermediate substrate of the semiconductor device according to one embodiment of the present invention.
Figure 15:
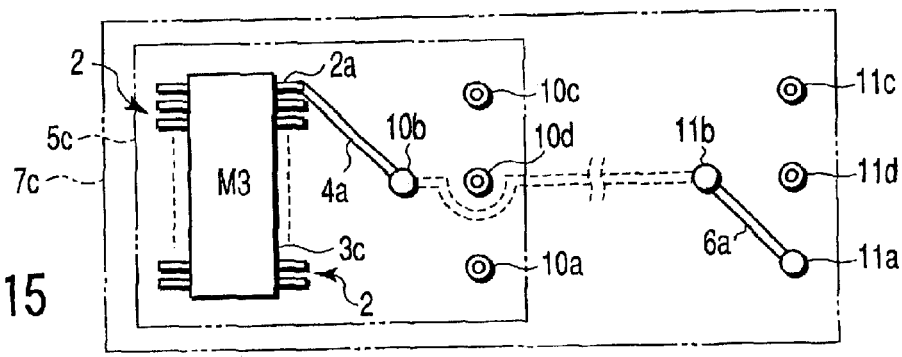
FIG. 15 is a plan view schematically showing a connection state of the memory chip, chip-mounting substrate, and third intermediate substrate of the semiconductor device according to one embodiment of the present invention.
Figure 16:
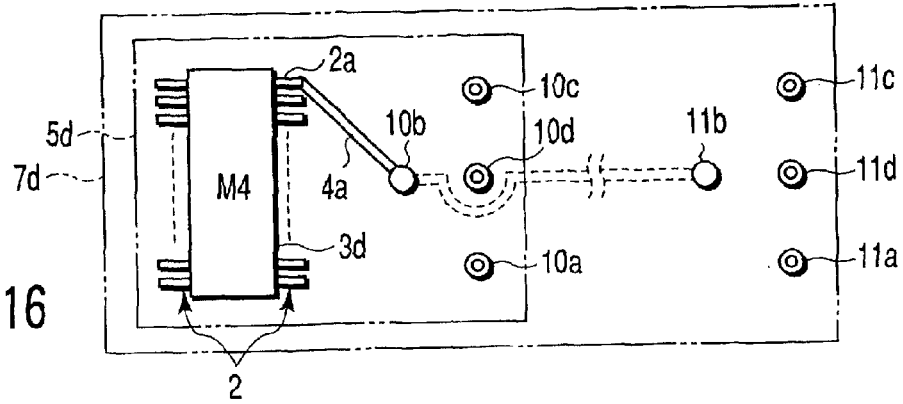
FIG. 16 is a plan view schematically showing a connection state of the memory chip, chip-mounting substrate, and fourth intermediate substrate of the semiconductor device according to one embodiment of the present invention.
Figure 17:
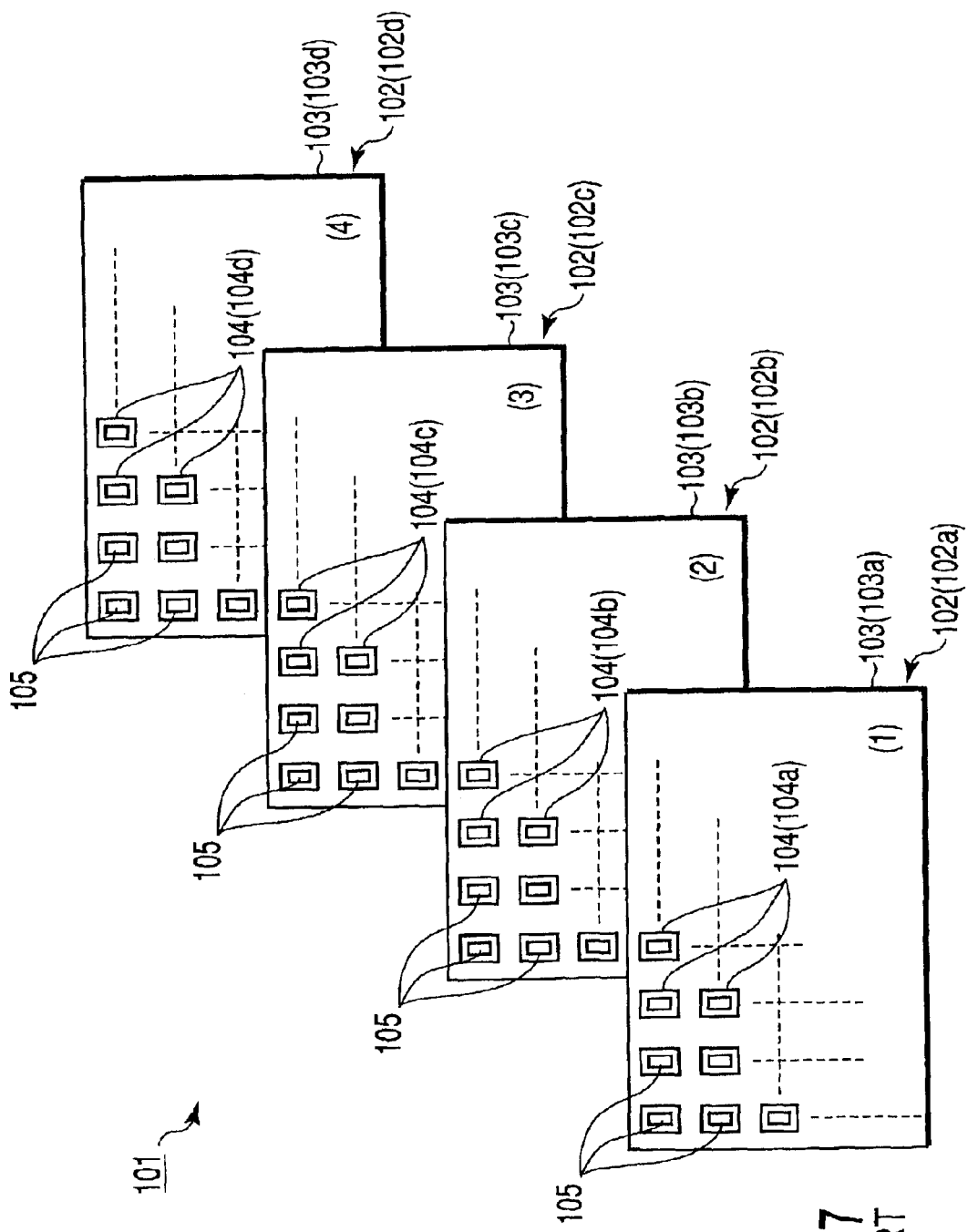
FIG. 17 is a plan view showing respective layers of a laminate semiconductor package as a prior art multi-layered semiconductor device in an exploded/disassembled state.
Figure 18:
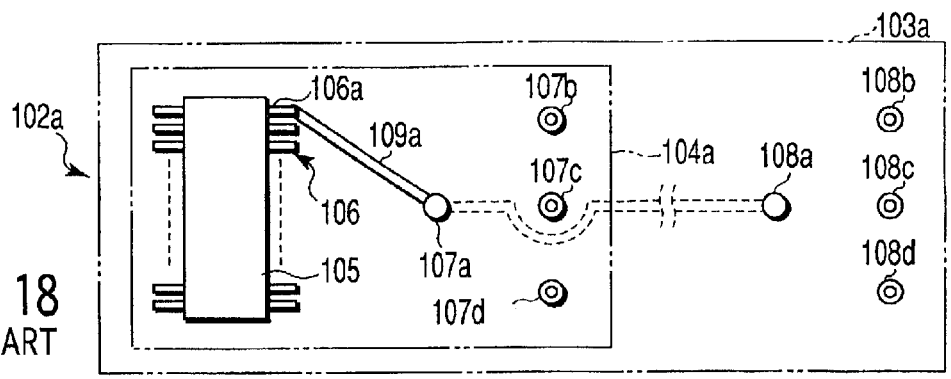
FIG. 18 is a plan view schematically showing a connection state of the memory chip, chip-mounting substrate, and first intermediate substrate of the prior art semiconductor device.
Figure 19:
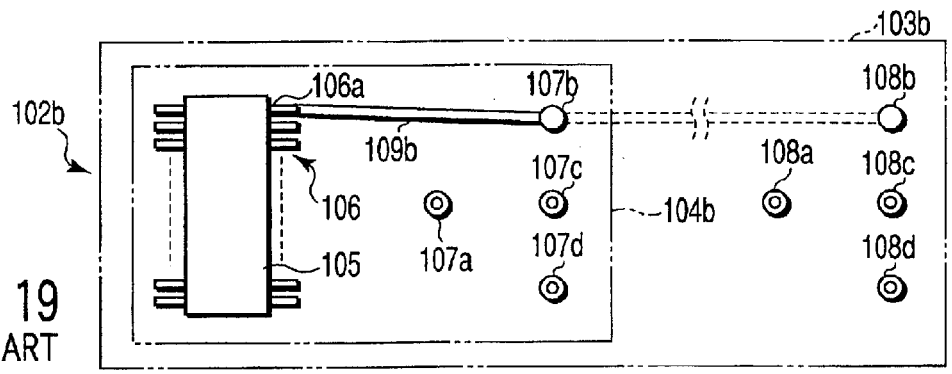
FIG. 19 is a plan view schematically showing a connection state of the memory chip, chip-mounting substrate, and second intermediate substrate of the prior art semiconductor device.
Figure 20:
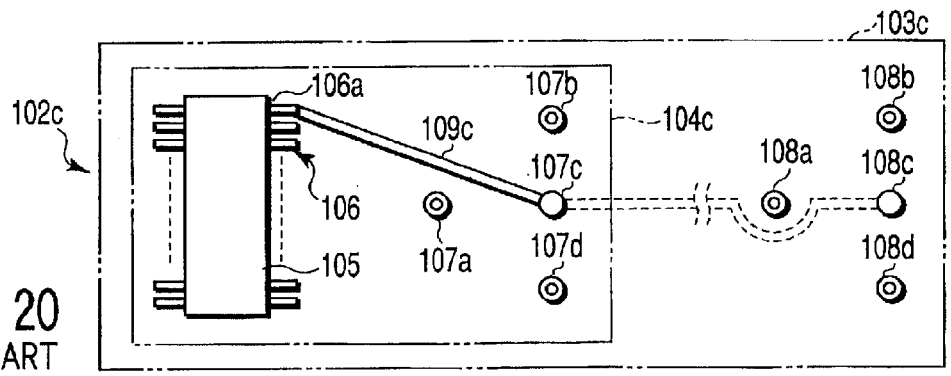
FIG. 20 is a plan view schematically showing a connection state of the memory chip, chip-mounting substrate, and third intermediate substrate of the prior art semiconductor device.
Figure 21:
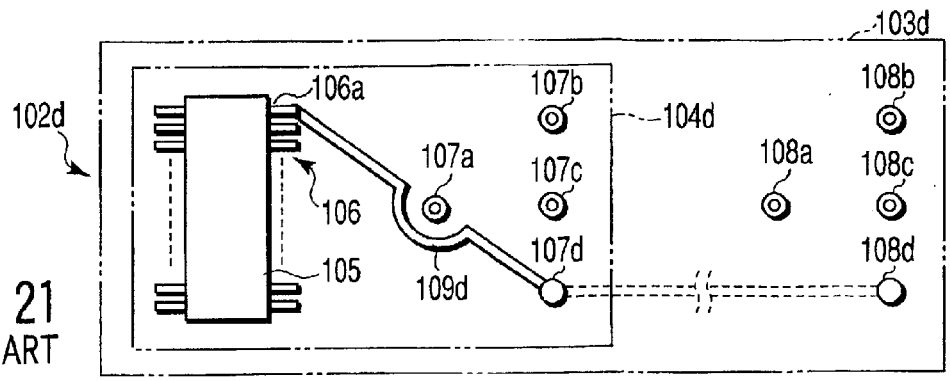
FIG. 21 is a plan view schematically showing a connection state of the memory chip, chip-mounting substrate, and fourth intermediate substrate of the prior art semiconductor device.

Additionally, FIGS. 1, 12, and 13 show the semiconductor chips 3 in different shapes. This is because the chips are intentionally drawn in the different shapes so that the characteristics of the present embodiment shown in the drawings can be easily understood. Therefore, the scope of the present invention is not adversely affected. To implement the present invention, the semiconductor chips 3 having various types, shapes, and structures can be used. Similarly, in FIGS. 1, and 13 to 21 for use in describing the present invention and prior art, the direction and posture of the semiconductor chip 3 mounted on the chip-mounting material 5, and the direction and posture of the intermediate material 7 with respect to the chip-mounting material 5 and semiconductor chip 3 are not limited to the state shown in the drawings. As long as the scope of the present invention is not adversely affected, various directions and postures can be set during the implementing of the present invention.

An outline of a manufacturing process of the DRAM module 1 will be next described concretely and briefly in terms of one example.

First, the corresponding M1 to M4 DRAM chips 3a to 3d are mounted on the first to fourth PTP substrates 5a to 5d, for example, by a flip chip method. Subsequently, the PTP substrates 5a to 5d with the chips mounted thereon, and the corresponding first to fourth IVH substrates 7a to 7d are alternately laminated along the thickness direction. In this case, the IVH substrates 7a to 7d are disposed in such a manner that the DRAM chips 3a to 3d are held in the chip cavities 21 in the IVH substrates 7a to 7d.

Subsequently, the laminated PTP substrates 5a to 5d and IVH substrates 7a to 7d are held from the outside of the laminate direction using the surface substrate 22, the power supply ground substrate 23 and ball layer substrate 24. In this case, the PTP substrates 5a to 5d, IVH substrates 7a to 7d, surface substrate 22, power supply ground substrate 23, and ball layer substrate 24 are superposed upon one another so that positioning marks 30 attached to the substrates agree with one another in the laminate direction. Moreover, adhesives, and the like may be also provided among the surface substrate 22, PTP substrates 5a to 5d, IVH substrates 7a to 7d, power supply ground substrate 23, and ball layer substrate 24.

After the chip mounting operation and laminating operation end, the superposed PTP substrates 5a to 5d, IVH substrates 7a to 7d, surface substrate 22, power supply ground substrate 23, and ball layer substrate 24 are pressurized and bonded along the laminate direction. Thereby, the desired DRAM module 1 is obtained. Thereby, the manufacturing process of the DRAM module 1 is ended.

As described above, in the DRAM module 1, the conductive paths of the terminals for signals 2 of the DRAM chips 3a to 3d along the laminate direction are switched by the interlayer connecting wirings 6 formed on the IVH substrates 7a to 7d, and set to predetermined paths for the layers. Thereby, the interlayer electric connection state of the terminals for signals 2 and the conductive path of the terminals for signals 2 and external terminals 8 along the laminate direction are appropriately and selectively switched and can be set to appropriate wiring states. As described above, the wiring patterns of the chip connecting wirings 4 and chip connecting via terminals 10 formed in the PTP substrates 5a to 5d are formed in the same pattern for all the layers. Even in this case, when the wiring patterns of the interlayer connecting wirings 6 of the IVH substrates 7a to 7d are appropriately set to the adequate wiring states for the respective layers, various conductive paths in the module can be flexibly set in accordance with the number of DRAM chips 3 and the memory constitution in the DRAM module 1.

That is, according to the semiconductor device 1 of the embodiment of the present invention, it is unnecessary to form the wiring patterns of the plurality of chip-mounting materials 5 in the patterns which differ with the layers. The wiring pattern of one of the plurality of intermediate materials 7 is changed, only one material is replaced with the intermediate material 7 having the different wiring pattern, or the intermediate materials 7 having different wiring patterns are combined and used, so that the semiconductor device 1 having various functions and characteristics can be constituted. According to the present invention characterized as described above, there can be provided a multi-layered semiconductor device which can be inexpensively and easily manufactured. Reasons for this will be briefly described hereinafter in terms of one concrete example.

For example, in the prior art multi-chip package 101, there are five types in total of the wiring patterns which have to be designed and formed in the manufacturing process: one type of the wiring pattern common to the first to fourth intermediate substrates 103a to 103d; and one type for each of the first to fourth chip-mounting substrates 104a to 104d. Moreover, as described above, every 200 substrates for each of the first to fourth chip-mounting substrates 104a to 104d each having one memory chip 105 mounted thereon are mounted on each of the first to fourth intermediate substrates 103a to 103d of the system blocks 102a to 102d of the first to fourth layers. In this case, during the manufacturing of one multi-chip package 101, every 200 substrates for each of the chip-mounting substrates 104a to 104d with the different wiring patterns formed therein are managed and classified for four layers so that the substrates of the layers are not mixed with one another. In this manner, 800 substrates in total have to be mounted on four intermediate substrates 103a to 103d with the same wiring pattern formed therein.

On the other hand, there are five types in total of the wiring patterns required in the DRAM module 1 formed of the same four-layers structure according to the embodiment of the present invention: one type of the wiring pattern common to all the first to fourth PTP substrates 5a to 5d; and four different types of wiring patterns for the first to fourth IVH substrates 7a to 7d. That is, the number of types of wiring patterns is the same as that of the prior art multi-chip package 101. Here, similarly as the multi-chip package 101, every 200 substrates for each of the first to fourth PTP substrates 5a to 5d with the DRAM chips 3 mounted thereon are mounted on each of the first to fourth IVH substrates 7a to 7d. In the DRAM module 1, since all the wiring patterns of the 800 substrates in total of the first to fourth PTP substrates 5a to 5d are the same, it is unnecessary to prevent the substrates of the layers from being mixed with one another. It is sufficient to manage the first to fourth IVH substrates 7a to 7d so that the four substrates are prevented from being mixed in the layer.

As a result, in the DRAM module 1, a generation ratio of defectives generated by a mounting error of the PTP substrates 5a to 5d with respect to the IVH substrates 7a to 7d can be remarkably effectively reduced, and a yield in the manufacturing process of the DRAM module 1 can be largely enhanced. Moreover, a substrate management, monitor operation, and the like in the manufacturing process can be also simplified. Therefore, the production efficiency of the DRAM module 1 can be largely enhanced, and the module can be easily manufactured. Furthermore, in the conventional art, 800 chip-mounting substrates 104a to 104d in total are divided into sets each including 200 substrates, and four types of wiring patterns need to be formed. However, in the DRAM module 1, the same pattern may be formed for 800 first to fourth PTP substrates 5a to 5d in total. As a result, a manufacturing cost per one DRAM module 1 can be remarkably reduced.

Additionally, the aforementioned effect of the present invention increases, when the number of laminations of the substrate and the number of mounted semiconductor chips 3 increase.

Moreover, the semiconductor device of the present invention is not limited to the aforementioned embodiment. Some of the constitutions of the semiconductor device according to the present invention can be combined and set in various states within the scope of the present invention.

For example, the capability, type, function, shape, constitution, and the like of the semiconductor chip 3 mounted on the semiconductor device 1 may be appropriately selected in accordance with the desired capability, function, and the like of the semiconductor device 1. This also applies to the number of laminations of the chip-mounting material 5 and intermediate material 7, the number of chip-mounting materials 5 mounted on the intermediate material 7, and the mounting number and method of the semiconductor chips 3 with respect to the chip-mounting material 5. Moreover, the wiring patterns among the semiconductor chip 3, chip-mounting material 5, and intermediate material 7, and the wiring pattern and circuit constitution of the whole semiconductor device 1 may be appropriately formed in an adequate state in accordance with the desired capability and function of the semiconductor device 1.

Furthermore, for example, the logic chip and memory chip may be mixed inside one semiconductor device 1.

Alternatively, two intermediate materials 7 may be superposed or laminated with respect to one chip-mounting material 5, or so-called dummy intermediate materials 7 with wirings not interfering with the function of the whole semiconductor device 1 formed therein may be disposed in addition to the originally necessary number of intermediate materials 7. For example, when the dummy intermediate material 7 functions as a fuse in the semiconductor device 1, the stability and reliability of the semiconductor device 1 can be enhanced. Furthermore, a wiring is connected to another logic board with the logic chip mounted thereon via the dummy intermediate material 7 from the chip-mounting material 5 with the memory chip mounted thereon, so that the dummy intermediate material 7 can function as a branch plate of the wiring in the semiconductor device 1.

Additional advantages and modifications will readily occur to those skilled in the art. Therefore, the invention in its broader embodiments is not limited to the specific details and representative embodiments shown and described herein. Accordingly, various modifications may be made without departing from the spirit or scope of the general inventive concept as defined by the appended claims and their equivalents.

What is claimed is:

1. A laminated-chip semiconductor device comprising:
    a semiconductor chip having a plurality of terminals for signals;
    a plurality of chip-mounting substrates on each of which at least one said semiconductor chip is mounted, and a plurality of chip connecting wirings electrically connected to said terminals for signals of said semiconductor chips which are mounted on said chip-mounting substrates are formed, and which are laminated in two or more layers in a thickness direction; and
    a plurality of intermediate substrates which are alternately arranged with respect to said plurality of chip-mounting substrates, and in which a plurality of interlayer connecting wirings electrically connected to said chip connecting wirings of an adjacent said chip-mounting substrate are formed,
    wherein each of said plurality of chip connecting wirings are formed in a same pattern with respect to each of said plurality of chip-mounting substrates, and
    each of said plurality of interlayer connecting wirings are formed in patterns such that a first electric connection state of said plurality of terminals for signals each other between said semiconductor chips each mounted on said chip-mounting substrates, or a second electric connection state between a plurality of external terminal connecting wirings electrically connected to a plurality of predetermined external terminals and each of said plurality of terminals for signals can be switched.

2. The semiconductor device according to claim 1, wherein said semiconductor chips are memory chips.

3. The semiconductor device according to claim 2, wherein each of said plurality of interlayer connecting wirings are formed in a wiring pattern such that terminals for data among said terminals for signals can be independently and electrically connected to said external terminal connecting wirings.

4. A laminated-chip semiconductor device comprising:
    a semiconductor chip having predetermined terminals for signals;
    a plurality of chip-mounting materials on each of which at least one said semiconductor chip is mounted, and which are laminated in two or more layers in a thickness direction;
    a plurality of chip connecting via terminals provided through each of said plurality of chip-mounting materials in said thickness direction;
    a plurality of chip connecting wirings which are formed in each of said plurality of chip-mounting materials, and electrically connected to said terminals for signals of said semiconductor chips which are mounted on each of said plurality of chip-mounting materials;
    a plurality of intermediate materials arranged alternately with each of said plurality of chip-mounting materials along a laminate direction of each of said plurality of chip-mounting materials;
    a plurality of interlayer connecting via terminals which are provided through said intermediate materials in said thickness direction, and electrically connected to said chip connecting wirings of said chip-mounting materials adjacent on one side; and
    a plurality of interlayer connecting wirings which are formed in predetermined patterns for each of layers in said intermediate materials so as to electrically connect said interlayer connecting via terminals to said predetermined chip connecting via terminals of said chip-mounting material adjacent on an other side.

5. The semiconductor according claim 4, wherein each of said plurality of chip connecting via terminals and said plurality of chip connecting wirings are formed in a same pattern with respect to each of said plurality of chip-mounting materials.

6. The semiconductor device according to claim 5, further comprising: a plurality of interlayer connecting via terminals which are provided through said intermediate materials in said thickness direction, and which electrically connecting said corresponding chip connecting via terminals among said chip connecting via terminals to each other in said thickness direction.

7. The semiconductor device according to claim 6, wherein said semiconductor chips are memory chips.

8. The semiconductor device according to claim 7, wherein each of said plurality of interlayer connecting wirings are formed in a wiring pattern such that terminals for data among said terminals for signals can be independently and electrically connected to said external terminal connecting wirings.

9. The semiconductor device according to claim 5, wherein said semiconductor chips are memory chips.

10. The semiconductor device according to claim 9, wherein each of said plurality of interlayer connecting wirings are formed in a wiring pattern such that terminals for data among said terminals for signals can be independently and electrically connected to each of said plurality of external terminal connecting wirings.

11. The semiconductor device according to claim 4, further comprising: a plurality of interlayer connecting via terminals which are provided through each of said plurality of intermediate materials in said thickness direction, and which electrically connect said corresponding chip connecting via terminals among said chip connecting via terminals to each other in said thickness direction.

12. The semiconductor device according to claim 11, wherein said semiconductor chips are memory chips.

13. The semiconductor device according to claim 12, wherein each of said plurality of interlayer connecting wirings are formed in a wiring pattern, such that terminals for data among said terminals for signals can be independently and electrically connected to said external terminal connecting wirings.

14. The semiconductor device according to claim 4, wherein said semiconductor chips are memory chips.

15. The semiconductor device according to claim 14, wherein each of said plurality of interlayer connecting wirings are formed in a wiring pattern such that terminals for data among said terminals for signals can be independently and electrically connected to said external terminal connecting wirings.

16. A laminated-chip semiconductor device comprising:
two chip-mounting substrates on each of which at least one semiconductor chip having a plurality of terminals for signals is mounted, and a plurality of chip connecting wirings electrically connected to said terminals for signals of said each semiconductor chip which are mounted on said chip-mounting substrates are formed in a same pattern, and which are laminated along a thickness direction;
a first intermediate substrate which is arranged between said two chip-mounting substrates, and in which a plurality of interlayer connecting wirings electrically connected to each of said plurality of chip connecting wirings of said adjacent chip-mounting substrates are formed in a predetermined wiring pattern; and
a second intermediate substrate which is laminated are arranged alternately with said first intermediate substrate with respect to said chip-mounting substrates, and in which a plurality of interlayer connecting wirings electrically connected to said chip connecting wirings of said adjacent chip-mounting substrate are formed in a wiring pattern different from said wiring pattern of said interlayer connecting wirings formed on said first intermediate substrate.

17. The semiconductor device according to claim 16, wherein said interlayer connecting wiring formed in said first intermediate substrate and said interlayer connecting wiring formed in said second intermediate substrate are formed in different wiring patterns so that conductive paths of said terminals for signals of said semiconductor chips each mounted on said each chip-mounting substrate can be set to different paths in a laminate direction.

18. The semiconductor device according to claim 16, wherein said interlayer connecting wiring formed in said first intermediate substrate, and said interlayer connecting wiring formed in said second intermediate substrate are formed in different wiring patterns so that an electric connection state of said terminals for signals between said semiconductor chips each mounted on said each chip-mounting substrate, or an electric connection state between a plurality of external terminal connecting wirings electrically connected to a plurality of predetermined external terminals and said terminals for signals can be switched in said intermediate substrate.

19. The semiconductor device according to claim 16, wherein said semiconductor chips are memory chips.

20. The semiconductor device according to claim 19, wherein each of said plurality of interlayer connecting wirings are formed in a wiring pattern such that terminals for data among said terminals for signals can be independently and electrically connected to each of said plurality of external terminal connecting wirings.

* * * * *

UNITED STATES PATENT AND TRADEMARK OFFICE
CERTIFICATE OF CORRECTION

PATENT NO. : 6,861,738 B2
DATED : March 1, 2005
INVENTOR(S) : Oyama et al.

It is certified that error appears in the above-identified patent and that said Letters Patent is hereby corrected as shown below:

Column 20,
Line 27, change "semiconductor" to -- semiconductor device --.
Line 35, change "connecting" to -- connect --.

Signed and Sealed this

Twenty-seventh Day of September, 2005

JON W. DUDAS
*Director of the United States Patent and Trademark Office*